US008619450B2

(12) United States Patent
Hamilton

(10) Patent No.: US 8,619,450 B2
(45) Date of Patent: Dec. 31, 2013

(54) METHOD FOR ADJUSTING A RESISTIVE CHANGE ELEMENT USING A REFERENCE

(75) Inventor: Darlene Hamilton, Lacey, WA (US)

(73) Assignee: Nantero Inc., Woburn, MA (US)

( * ) Notice: Subject to any disclaimer, the term of this patent is extended or adjusted under 35 U.S.C. 154(b) by 133 days.

(21) Appl. No.: 12/873,946

(22) Filed: Sep. 1, 2010

(65) Prior Publication Data
US 2011/0051499 A1    Mar. 3, 2011

Related U.S. Application Data

(63) Continuation-in-part of application No. 12/618,448, filed on Nov. 13, 2009, now Pat. No. 8,000,127.

(60) Provisional application No. 61/233,474, filed on Aug. 12, 2009.

(51) Int. Cl.
G11C 27/00  (2006.01)
(52) U.S. Cl.
USPC .......... 365/46; 365/55; 365/74; 365/97; 365/100; 365/131; 365/148; 365/158; 365/171; 365/173; 365/163
(58) Field of Classification Search
USPC ......... 365/148, 163, 46, 55, 74, 97, 100, 131, 365/158, 171, 173; 977/742, 943
See application file for complete search history.

(56) References Cited

U.S. PATENT DOCUMENTS

| | | | |
|---|---|---|---|
| 6,422,450 B1 | 7/2002 | Zhou et al. | |
| 6,423,583 B1 | 7/2002 | Avouris et al. | |
| 6,528,020 B1 | 3/2003 | Dai et al. | |
| 6,706,402 B2 | 3/2004 | Rueckes et al. | |
| 6,808,746 B1 | 10/2004 | Dai et al. | |
| 6,835,591 B2 | 12/2004 | Rueckes et al. | |
| 6,888,773 B2 | 5/2005 | Morimoto | |
| 6,890,780 B2 | 5/2005 | Lee | |
| 6,894,359 B2 | 5/2005 | Bradley et al. | |
| 6,899,945 B2 | 5/2005 | Smalley et al. | |
| 6,905,892 B2 | 6/2005 | Esmark et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 7,015,500 B2 | 3/2006 | Choi et al. | |
| 7,115,901 B2 | 10/2006 | Bertin et al. | |
| 7,161,403 B2 | 1/2007 | Bertin | |
| 7,335,395 B2 | 2/2008 | Ward et al. | |
| 7,365,632 B2 | 4/2008 | Bertin et al. | |
| 7,366,009 B2 * | 4/2008 | Katti | 365/158 |

(Continued)

OTHER PUBLICATIONS

Avouris, P., et al., "Carbon Nanotube Electronics," Chemical Physics, 2002, vol. 284, pp. 429-445.

(Continued)

Primary Examiner — Fernando Hidalgo
(74) Attorney, Agent, or Firm — Nantero Inc.

(57) ABSTRACT

A method of adjusting a resistive change element using a reference is disclosed. The method comprises inspecting a resistive change element to determine a first state; comparing the first state to a reference wherein said reference provides stimulus parameters corresponding to a transition from the first state to a second state; and applying the stimulus parameters to the resistive change element. A resistive change memory cell array is also disclosed.

35 Claims, 24 Drawing Sheets

(56) References Cited

U.S. PATENT DOCUMENTS

| | | | |
|---|---|---|---|
| 7,667,999 B2 | 2/2010 | Herner et al. | |
| 7,826,248 B2* | 11/2010 | Xi et al. | 365/148 |
| 7,902,537 B2* | 3/2011 | Schricker et al. | 257/2 |
| 7,982,209 B2 | 7/2011 | Herner et al. | |
| 8,299,450 B2* | 10/2012 | Ahn et al. | 257/2 |
| 2002/0175390 A1 | 11/2002 | Goldstein et al. | |
| 2004/0031975 A1 | 2/2004 | Kern et al. | |
| 2004/0132070 A1 | 7/2004 | Star et al. | |
| 2004/0266106 A1 | 12/2004 | Lee | |
| 2005/0212014 A1 | 9/2005 | Horibe et al. | |
| 2006/0250843 A1 | 11/2006 | Bertin et al. | |
| 2006/0250856 A1 | 11/2006 | Bertin et al. | |
| 2006/0258122 A1 | 11/2006 | Whitefield et al. | |
| 2006/0264053 A1 | 11/2006 | Yates | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2008/0012047 A1 | 1/2008 | Bertin et al. | |
| 2008/0142850 A1 | 6/2008 | Bertin et al. | |
| 2008/0157126 A1 | 7/2008 | Bertin et al. | |
| 2008/0157127 A1* | 7/2008 | Bertin et al. | 257/209 |
| 2008/0159042 A1 | 7/2008 | Bertin et al. | |
| 2008/0170429 A1* | 7/2008 | Bertin et al. | 365/151 |
| 2009/0166609 A1 | 7/2009 | Schricker et al. | |
| 2009/0166610 A1 | 7/2009 | Schricker et al. | |
| 2009/0168491 A1 | 7/2009 | Schricker et al. | |
| 2010/0142256 A1* | 6/2010 | Kumar et al. | 365/148 |
| 2010/0328996 A1* | 12/2010 | Shih et al. | 365/163 |
| 2011/0038195 A1* | 2/2011 | Hamilton et al. | 365/148 |

OTHER PUBLICATIONS

Awano, Y., "Graphene for VLSI: FET and Interconnect Applications" IEDM 2009 Technical Digest, pp. 10.1.1-10.1.4.

Brown, K.M. "System in package The Rebirth of SIP", 2004 IEEE Custom Integrated Circuits Conference, May 2004.

Collins, P. G. et al., "Engineering Carbon Nanotubes and Nanotube Circuits Using Electrical Breakdown", Science, vol. 292, pp. 706-709, Apr. 27, 2001.

Crowley, M. et al., "512 Mb PROM with 8 layers of antifuse/Diode cells," IEEE International Solid-State Circuits Conference, vol. XLVI, pp. 284-285, Feb. 2003.

Cui, J.B. et al., "Carbon nanotube memory devices of high charge storage stability," Applied Physics Letters, vol. 81, No. 17, Oct. 21, 2002, pp. 3260-3262.

Derycke, V., et al., "Carbon Nanotube Inter- and Intramolecular Logic Gates," Nano Letters, Sep. 2001, vol. 1, No. 9, pp. 453-456.

Fuhrer, M.S. et al., "High-Mobility Nanotube Transistor Memory," Nano Letters, 2002, vol. 2, No. 7, pp. 755-759.

Hone, J., "Phonons and Thermal Properties of Carbon Nanotubes", *Carbon Nanotubes, Topics Appl. Phys.*, vol. 80, pp. 273-286, 2001.

Huai, Y. "Spin-Transfer Torque MRAM (STT-MTAM): Challenges and Prospects" AAPS Bulletin Dec. 2008, vol. 18, No. 6, pp. 33-40.

Jiang, Y. et al., "Performance Breakthrough in 8nm Gate-All-Around Length Gate-All-Around Nanowire Transistors using Metallic Nanowire Contacts" 2008 Symposium on VLSI Technology Digest of Technical Papers, pp. 34-35.

Johnson, R. Colin, "IBM fellow unrolls blueprint for nano", *EETimes*, Mar. 6, 2006, 3 pages, http://www.eetimes.com/showArticle.jhtml?articleID=181500304.

Kianian, S. et al., "A 3D Stackable Carbon Nanotube-based Nonvolatile Memory (NRAM)," ESSDERC, Jun. 14, 2010, Nantero, Inc.

Kong, J. et al., "Quantum Interference and Ballistic Transmission in Nanotube Electron Waveguides", *The American Physical Society*, vol. 87, No. 10, pp. 106801-1-106801-4, Sep. 3, 2001.

Langer, L. et al., "Electrical Resistance of a Carbon Nanotube Bundle," J. Mater. Res. vol. 9, No. 4, Apr. 1994, 6 pages.

Novak, J.P. et al., "Nerve agent detection using networks of single-walled carbon nanotubes," Applied Physics Letters, vol. 83, No. 19, Nov. 10, 2003, pp. 4026-4028.

Onoa et al., "Bulk Production of singly dispersed carbon nanotubes with prescriped lengths", *Nanotechnology*, vol. 16, pp. 2799-2803, 2005.

Rueckes, T., et al., "Carbon Nanotube-Based Nonvolatile Random Access Memory for Molecular Computing," Science, Jul. 7, 2000, vol. 289, pp. 94-97.

Servalli, G. "A 45nm Generation Phase Change Memory Technology," IEDM 2009 Technical Digest, pp. 5.7.1-5.7.4.

Snow, E.S. et al., "Random networks of carbon nanotubes as an electronic material," Applied Physics Letters, vol. 82, No. 13, Mar. 31, 2003, pp. 2145-2147.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

Amblard, G., Development and characterization of carbon nanotube processes for NRAM technology, Proc. of SPIE, 2011, vol. 7970, pp. 797017-1-797017-7.

Brock, et al., "Caron Nanotube Memories and Fabrics in a Radiation Hard Semiconductor Foundry," 2005 IEEE Conference, 9 pgs.

Rosendale, et al., "A 4 Megabit Carbon Nanotube-based Nonvolatile Memory (NRAM)," ESSCIRC 2010 Proceedings, Sep. 2010, pp. 478-481.

Ward, et al., "A Non-Volatile Nanoelectromechanical Memory Element Utilizing a Fabric of Carbon Nanotubes," IEEE 2004, pp. 34-38.

\* cited by examiner

| Initial state (Current) ⌇610a | Voltage Height ⌇620a | Pulse Width ⌇630a |
|---|---|---|
| 300-500 nA | 1.5 V | 5 μs |
| 200-300 nA | 2 V | 5 μs |
| 150-200 nA | 2.5 V | 5 μs |
| 120-150 nA | 2.25 V | 10 μs |
| 100-120 nA | 2.5 V | 10 μs |
| 90-100 nA | 2.75 V | 20 μs |
| 80-90 nA | 2.5 V | 50 μs |
| 70-80 nA | 3 V | 500 μs |
| 50-70 nA | 2.5 V | 5 ms |
| 15-50 nA | 2.5 V | 10 ms |
| 0-15 nA | 2.5 V | 20 ms |

LOOKUP TABLE FOR SET OPERATION

Fig. 6A

LOOKUP TABLE FOR SET OPERATION

| Initial state (Resistance) 610b | Voltage Height 620b | Pulse Width 630b |
|---|---|---|
| 0-25 kΩ | 1.5 V | 5 µs |
| 25-75 kΩ | 2 V | 5 µs |
| 75-100 kΩ | 2.5 V | 5 µs |
| 100-125 kΩ | 2.25 V | 10 µs |
| 125-150 kΩ | 2.5 V | 10 µs |
| 150-175 kΩ | 2.75 V | 20 µs |
| 175-210 kΩ | 2.5 V | 50 µs |
| 210-240 kΩ | 3 V | 500 µs |
| 240-280 kΩ | 2.5 V | 5 ms |
| 280-350 kΩ | 2.5 V | 10 ms |
| 350-500 kΩ | 2.5 V | 20 ms |

Fig. 6B

| Initial state (Current) 610c | Voltage Height 620c | Pulse Width 630c | Rise Time 640c | Series Resistance 650c |
|---|---|---|---|---|
| 300-500 nA | 1.5 V | 5 µs | 0.25 µs | 100 kΩ |
| 200-300 nA | 2 V | 5 µs | 0.25 µs | 120 kΩ |
| 150-200 nA | 2.5 V | 5 µs | 0.5 µs | 120 kΩ |
| 120-150 nA | 2.25 V | 10 µs | 1 µs | 120 kΩ |
| 100-120 nA | 2.5 V | 10 µs | 1 µs | 120 kΩ |
| 90-100 nA | 2.75 V | 20 µs | 1.5 µs | 120 kΩ |
| 80-90 nA | 2.5 V | 50 µs | 3.5 µs | 140 kΩ |
| 70-80 nA | 3 V | 500 µs | 5.5 µs | 140 kΩ |
| 50-70 nA | 2.5 V | 5 ms | 100 µs | 160 kΩ |
| 15-50 nA | 2.5 V | 10 ms | 150 µs | 180 kΩ |
| 0-15 nA | 2.5 V | 20 ms | 250 µs | 200 kΩ |

LOOKUP TABLE FOR SET OPERATION

Fig. 6C

| Initial state (Resistance) ⌒610d | Voltage Height ⌒620d | Pulse Width ⌒630d |
|---|---|---|
| 350-500 kΩ | 1 V | 5 µs |
| 280-350 kΩ | 2 V | 10 µs |
| 240-280 kΩ | 2.5 V | 10 µs |
| 210-240 kΩ | 2.25 V | 10 µs |
| 175-210 kΩ | 2.65 V | 15 µs |
| 150-175 kΩ | 2.75 V | 20 µs |
| 125-150 kΩ | 2.35 V | 50 µs |
| 100-125 kΩ | 3 V | 500 µs |
| 75-100 kΩ | 2.15 V | 5 ms |
| 25-75 kΩ | 2.25 V | 15 ms |
| 0-25 kΩ | 2.55 V | 30 ms |

LOOKUP TABLE FOR RESET OPERATION

Fig. 6D

| Initial state (Current) ⌒610e | Voltage Height ⌒620e | Pulse Width ⌒630e |
|---|---|---|
| 0-15 nA | 1 V | 5 µs |
| 15-50 nA | 2 V | 10 µs |
| 50-70 nA | 2.5 V | 10 µs |
| 70-80 nA | 2.25 V | 10 µs |
| 80-90 nA | 2.65 V | 15 µs |
| 90-100 nA | 2.75 V | 20 µs |
| 100-120 nA | 2.35 V | 50 µs |
| 120-150 nA | 3 V | 500 µs |
| 150-200 nA | 2.15 V | 5 ms |
| 200-300 nA | 2.25 V | 15 ms |
| 300-500 nA | 2.55 V | 30 ms |

LOOKUP TABLE FOR RESET OPERATION

Fig. 6E

| Initial state (Current) ⌐610f | Voltage Height ⌐620f | Pulse Width ⌐630f | Rise Time ⌐640f | Series Resistance ⌐650f |
| --- | --- | --- | --- | --- |
| 0-15 nA | 1 V | 5 µs | 0.25 µs | 100 kΩ |
| 15-50 nA | 2 V | 10 µs | 0.25 µs | 120 kΩ |
| 50-70 nA | 2.5 V | 10 µs | 0.5 µs | 120 kΩ |
| 70-80 nA | 2.25 V | 10 µs | 1 µs | 120 kΩ |
| 80-90 nA | 2.65 V | 15 µs | 1 µs | 120 kΩ |
| 90-100 nA | 2.75 V | 20 µs | 1.5 µs | 120 kΩ |
| 100-120 nA | 2.35 V | 50 µs | 3.5 µs | 140 kΩ |
| 120-150 nA | 3 V | 500 µs | 5.5 µs | 140 kΩ |
| 150-200 nA | 2.15 V | 5 ms | 100 µs | 160 kΩ |
| 200-300 nA | 2.25 V | 15 ms | 150 µs | 180 kΩ |
| 300-500 nA | 2.55 V | 30 ms | 250 µs | 200 kΩ |

LOOKUP TABLE FOR RESET OPERATION

Fig. 6F

| Source State | Destination State | Programming Parameter |
|---|---|---|
| Set | Reset | A |
| Zone 1 | Reset | B |
| Zone 2 | Reset | C |
| Zone 3 | Reset | D |
| Zone 4 | Reset | E |
| Zone 5 | Reset | F |
| Zone 6 | Reset | G |
| Zone 7 | Reset | H |
| Zone 8 | Reset | I |
| Zone 9 | Reset | J |
| Reset | | NOP |

| Name | State (Resistance) |
|---|---|
| Set | 0-25 kΩ |
| Zone 1 | 25-75 kΩ |
| Zone 2 | 75-100 kΩ |
| Zone 3 | 100-125 kΩ |
| Zone 4 | 125-150 kΩ |
| Zone 5 | 150-175 kΩ |
| Zone 6 | 175-210 kΩ |
| Zone 7 | 210-240 kΩ |
| Zone 8 | 240-280 kΩ |
| Zone 9 | 280-350 kΩ |
| Zone 10 | 350-500 kΩ |
| Reset | 500-600 kΩ |

| Name | Voltage Height | Pulse Width |
|---|---|---|
| A | 1.5 V | 5 μs |
| B | 2 V | 5 μs |
| C | 2.5 V | 5 μs |
| D | 2.25 V | 10 μs |
| E | 2.5 V | 10 μs |
| F | 2.75 V | 20 μs |
| G | 2.5 V | 50 μs |
| H | 3 V | 500 μs |
| I | 2.5 V | 5 ms |
| J | 2.5 V | 10 ms |
| NOP | 0 V | 0 ms |

GENERAL LOOKUP TABLE FOR RESET OPERATION

Fig. 7A

| 715b Source State | 720b Destination State | 725b Programming Parameter |
|---|---|---|
| Value 00 | Value 11 | A |
| Zone 1 | Value 11 | B |
| Zone 2 | Value 11 | C |
| ... | ... | ... |
| Value 00 | Value 10 | G |
| Zone 12 | Value 10 | H |
| Zone 13 | Value 10 | I |
| ... | ... | ... |
| Value 00 | Value 01 | M |
| Zone 25 | Value 01 | N |
| Zone 26 | Value 01 | O |
| ... | ... | ... |
| Value 00 | Value 00 | T |
| Zone 38 | Value 00 | U |
| Zone 39 | Value 00 | V |
| Value 10 | Value 11 | AA |
| Zone 54 | Value 11 | AB |
| Value 10 | Value 00 | AJ |
| Value 11 | Value 10 | AM |
| Value 10 | Value 01 | AP |
| Zone 99 | Zone 42 | BC |

710b

| 750b Name | 760b State (Resistance) |
|---|---|
| Value 11 | 0-25 kΩ |
| Zone 1 | 25-75 kΩ |
| Zone 2 | 75-100 kΩ |
| ... | ... |
| Value 10 | 150-200 kΩ |
| ... | ... |
| Value 01 | 350-400 kΩ |
| ... | ... |
| Value 00 | 450-500 kΩ |
| ... | ... |
| Zone 74 | 600-650 kΩ |

740b

| 775b Name | 780b Voltage Height | 785b Pulse Width |
|---|---|---|
| A | 1.5 V | 5 μs |
| B | 2 V | 5 μs |
| C | 2.5 V | 5 μs |
| D | 2.25 V | 10 μs |
| E | 2.5 V | 10 μs |
| F | 2.75 V | 20 μs |
| G | 2.5 V | 50 μs |
| H | 3 V | 500 μs |
| I | 2.5 V | 5 ms |
| ... | ... | ... |
| NOP | 0 V | 0 ms |

770b

GENERAL LOOKUP TABLE FOR ANY OPERATION

Fig. 7B

METHOD FOR ADJUSTING A RESISTIVE CHANGE ELEMENT USING A REFERENCE

CROSS-REFERENCE TO RELATED CASES

This application is a continuation-in-part of and claims priority under 35 U.S.C. §120 to U.S. patent application Ser. No. 12/618,448, filed on Nov. 13, 2009, entitled "Method for Resetting a Resistive Change Memory Element," the contents of which are incorporated herein in their entirety by reference, which claims priority under 35 U.S.C. §119(e) to U.S. Provisional Patent Application Ser. No. 61/233,474, filed on Aug. 12, 2009, entitled "A Method for Resetting a Resistive Change Memory Element," the contents of which are incorporated herein in their entirety by reference.

This application is related to the following U.S. Patents, which are assigned to the assignee of the present application, and are hereby incorporated by reference in their entirety:
- U.S. Pat. No. 6,835,591, filed on Apr. 23, 2002, entitled Methods of Nanotube Films and Articles;
- U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;
- U.S. Pat. No. 6,706,402, filed on Mar. 16, 2004, entitled Nanotube Films and Articles;
- U.S. Pat. No. 7,115,901, filed on Jun. 9, 2004, entitled Non-Volatile Electromechanical Field Effect Devices and Circuits Using Same and Methods of Forming Same; and
- U.S. Pat. No. 7,365,632, filed on Sep. 20, 2005, entitled Resistive Elements Using Carbon Nanotubes.

This application is related to the following U.S. Patent Applications, which are assigned to the assignee of the application, and are hereby incorporated by reference in their entirety:
- U.S. patent application Ser. No. 11/280,786, filed on Nov. 15, 2005, entitled Two-Terminal Nanotube Devices and Systems and Methods of Making Same;
- U.S. patent application Ser. No. 11/398,126, filed on Apr. 5, 2006, entitled Nanotube Articles with Adjustable Electrical Conductivity and Methods of Making Same;
- U.S. patent application Ser. No. 11/835,856, filed on Aug. 8, 2008, entitled Nonvolatile Nanotube Diodes and Nonvolatile Nanotube Blocks and Systems Using Same and Methods of Making Same; and
- U.S. patent application Ser. No. 12/536,803, filed on Aug. 6, 2009, entitled Nonvolatile Nanotube Programmable Logic Devices and a Nonvolatile Nanotube Field Programmable Gate Array Using Same.
- U.S. patent application Ser. No. 12/618,448, filed on Nov. 13, 2009, entitled Method for Resetting a Resistive Change Memory Element.

BACKGROUND

1. Technical Field

The present disclosure relates generally to resistive change elements, and, more specifically, to a method of programming resistive change elements wherein a set of programming parameters is used to program the resistive change elements.

2. Discussion of Related Art

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual memory cell between two or more resistive states. For example, each resistive state within a resistive change memory cell can correspond to a data value which can be programmed and read back by supporting circuitry within the device or array.

For example, a resistive change element might be arranged to switch between two resistive states: a high resistive state (which might correspond to a logic "0") and a low resistive state (which might correspond to a logic "1"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store four bits of data. Or a resistive change element might be arranged to switch between $2^n$ resistive states, so as to store n bits of data.

Within the current state of the art, there is an increasing need to reliably and rapidly control the switching of resistive change elements as they are adjusted from one resistive state to another.

To this end, it would be advantageous if a programming method would perform an operation on a resistive change element in as few steps as possible.

SUMMARY

The present disclosure relates to methods of adjusting a resistive change element and, more specifically, to a method for adjusting a resistive change element which performs the operation in as few steps as possible through using a lookup table.

In particular, the present disclosure provides a method for adjusting the resistance of a non-volatile resistive change element. Under one aspect of the present disclosure, the method first comprises inspecting a resistive change element to determine a first state. The method further comprises comparing the first state to a reference wherein the reference provides stimulus parameters corresponding to a transition from the first state to a second state. The method further comprises applying the stimulus parameters to the resistive change element.

Under another aspect of the present disclosure a resistive change memory array is disclosed. In particular, the present disclosure provides a resistive change memory array. The resistive change memory array comprises a processing element. The resistive change memory array further comprises a plurality of resistive change memory cells, the plurality of resistive memory cells individually addressable by the processing element, each resistive change memory cell having a plurality of states. The resistive change memory array further comprises a programming circuit responsive to the processing element. The resistive change memory array further comprises a memory storage element, the memory storage element containing a look up table comprising a plurality of programmed states and a plurality of corresponding programming parameter sets; wherein said programming circuit is electrically coupled to said plurality of resistive change memory cells and constructed so as to provide stimulus for adjusting the state of said resistive change memory cells; wherein said stimulus is determined by a programmed state and a corresponding programming parameter set.

Other features and advantages of the present disclosure will become apparent from the following description of the invention which is provided below in relation to the accompanying drawings.

BRIEF DESCRIPTION OF THE DRAWINGS

In the Drawings,

FIGS. 6A-6F show exemplary lookup tables for a set operation and lookup tables for a reset operation.

FIG. 7A-7B show exemplary look up tables for any operation.

DETAILED DESCRIPTION

The present disclosure relates to a method of adjusting a resistive change element from one resistive state to another resistive state, such that the adjustment occurs in as few steps as possible. Specifically, the present disclosure describes methods for adjusting the resistive state of a resistive change element from a first resistive state to a second resistive state in response to stimulus. A resistive change element is inspected to determine a first resistive state. The stimulus is selected by comparing the first resistive state to an established reference. The stimulus can be, for example, an electrical signal. A reference could take the form of a look-up table which includes a plurality of programming parameter sets associated with initial resistance values. A look-up table is used an exemplary reference, however the methods of the present disclosure are not limited in this regard. Indeed, a reference, as described by the methods of the present disclosure could take the form of, for example but not limited to, a software database, hardware circuitry, an encoded EPROM, or other data storage elements.

Resistive change memory cells store information through the use of a resistive change element within the cell. Responsive to electrical stimulus, this resistive change element can be adjusted between at least two non-volatile resistive states. Typically, two resistive states are used: a low resistive state (corresponding, typically, to a logic '1,' a set state) and a high resistive state (corresponding, typically, to a logic '0,' a reset state). In this way, the resistance value of the resistive change element within the resistive change memory cell can be used to a store a bit of information. According to other aspects of the present disclosure, more than two resistive states are used, allowing a single cell to store more than one bit of information. For example, a resistive change memory cell might adjust its resistive change element between four non-volatile resistive states, allowing for the storage of two bits of information in a single cell.

Resistive change elements can use, for example, two-terminal switches, block switches, phase change memory, or metal oxides, as well as other materials and designs.

Though the present disclosure uses resistive change memory cells as an example, the disclosure is not limited to memory. Indeed, the methods of the present disclosure could be used to adjust the resistance of resistive change elements within logic devices, analog circuitry, and the like.

Figure 1:
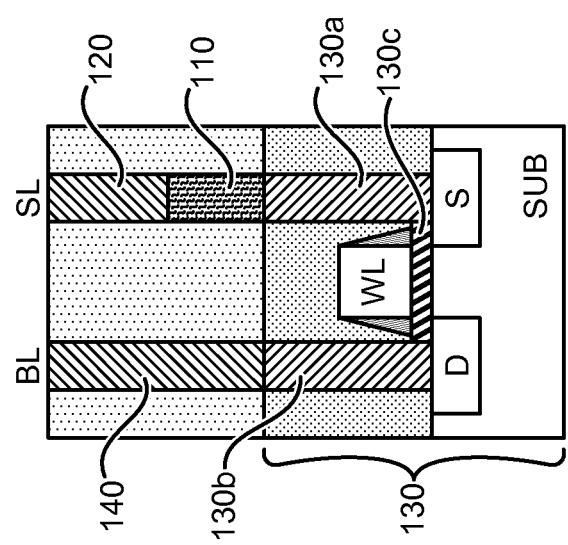
FIG. 1 illustrates an exemplary layout of a vertically oriented resistive change memory cell, according to one aspect of the invention.

FIG. 1 illustrates the layout of an exemplary resistive change memory cell which includes a vertically oriented resistive change element (such a structure is sometimes termed a 3D memory cell by those skilled in the art). A typical FET device 130 is formed within a first device layer, including a drain D, a source S, and a gate structure 130c. The structure and fabrication of such an FET device 130 will be well known to those skilled in the art.

A resistive change element 110 is formed in a second device layer. Conductive structure 130a electrically couples a first end of resistive change element 110 with the source terminal of FET device 130. Conductive structure 120 electrically couples a second end of resistive change element 110 with an external source line SL outside the memory cell. Conductive structures 130b and 140 electrically couple the drain terminal of FET device 130 with an external bit line BL. An external word line WL is electrically coupled to gate structure 130c.

Figure 2:
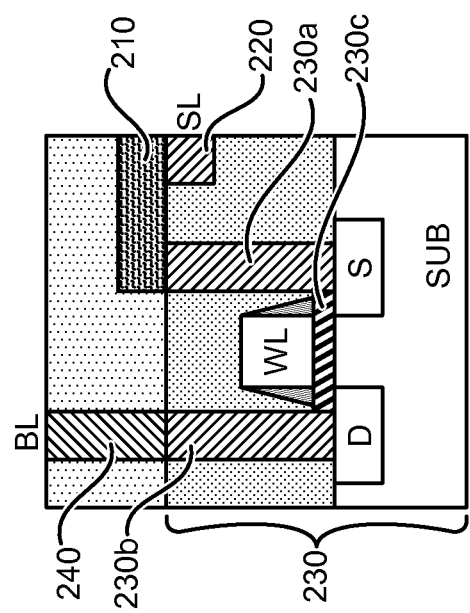
FIG. 2 illustrates an exemplary layout of a horizontally oriented resistive change memory cell, according to one aspect of the invention.

FIG. 2 illustrates the layout of an exemplary resistive change memory cell which includes a horizontally oriented resistive change element (such a structure is sometimes termed a 2D memory cell by those skilled in the art). A typical FET device 230 is formed within a first device layer, including a drain D, a source S, and a gate structure 230c. As with the FET device (130) depicted in FIG. 1, the structure and fabrication of such an FET device 230 will be well known to those skilled in the art.

A resistive change element 210 is formed in a second device layer. Conductive structure 230a electrically couples a first end of resistive change element 210 with the source terminal of FET device 230. Conductive structure 220 electrically couples a second end of resistive change element 210 with an external source line SL outside the memory cell. Conductive structures 230b and 240 electrically couple the drain terminal of FET device 230 with an external bit line BL. An external word line WL is electrically coupled to gate structure 230c.

Within both of the memory cells depicted in FIGS. 1 and 2, the resistive change element is adjusted between different resistive states by applying electrical stimulus, typically one or more programming pulses of specific voltages and pulse widths, between the bit line (BL) and the source line (SL). A voltage is applied to the gate structure (130c in FIG. 1 and 230c in FIG. 2) through the word line (WL) which allows electrical current to flow through the series combination of the FET device (130 in FIGS. 1 and 230 in FIG. 2) (which, depending on the gate voltage applied, may act as a current limiting device) and the resistive change element (110 in FIG. 1 and 210 in FIG. 2). By controlling the magnitude and the duration of this electrical current, the resistive change element (110 in FIG. 1 and 210 in FIG. 2) can be adjusted between a plurality of resistive states.

The state of the memory cells depicted in FIGS. 1 and 2 can be determined, for example, by applying a DC test voltage, for example, but not limited to, 0.5V, between the source line (SL) and the bit line (BL) while applying a voltage to gate structure (130c in FIG. 1 and 230c in FIG. 2) sufficient to turn on the FET device (130 in FIG. 1 and 230 in FIG. 2) and measuring the current through the resistive change element (110 in FIG. 1 and 210 in FIG. 2). In some applications this current can be measured by using a power supply with a current feedback output, for example, a programmable power supply or a sense amplifier. In other applications this current can be measured by inserting a current measuring device in series with the resistive change element (110 in FIG. 1 and 210 in FIG. 2).

Alternatively, the state of the memory cells depicted in FIGS. 1 and 2 can also be determined, for example, by driving a fixed DC current, for example, but not limited to, 1 µA, through the series combination of the FET device (130 in FIG. 1 and 230 in FIG. 2) and the resistive change element (110 in FIG. 1 and 210 in FIG. 2) while applying a voltage to the gate (130c in FIG. 1 and 230c in FIG. 2) sufficient to turn on the FET device (130 in FIG. 1 and 230 in FIG. 2) and measuring the voltage across the resistive change element (110 in FIG. 1 and 210 in FIG. 2).

The resistive change element (such as, but not limited to, those depicted in FIGS. 1 and 2) can be formed from a plurality of materials, such as, but not limited to, metal oxide, solid electrolyte, phase change material such as a chalcogenide glass, and carbon nanotubes.

For example, U.S. patent application Ser. No. 11/280,786 to Bertin et al., incorporated herein by reference, discloses a two terminal nanotube switching device comprising a first and second conductive terminals and a nanotube article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. patent application Ser. No. 11/280,786) the resistivity of the nanotube article can be repeatedly switched between a relatively high resistive state and relatively low resistive state. In certain embodiments, these high and low resistive states can be used to store a bit of information.

While some examples of resistive change memory cells and elements within the present disclosure specifically reference carbon nanotube based resistive change memory cells and elements, the methods of the present disclosure are not limited in this regard. Indeed, it will be clear to those skilled in the art that the methods of the present disclosure are applicable to any type of resistive change memory cell or element.

FIGS. 3A-3D are exemplary schematics of programming circuits which can be used to generate and apply electrical stimuli, for example, programming pulses of predetermined voltage levels and pulse widths, to a resistive change element within a resistive change memory cell.

Figure 3A:
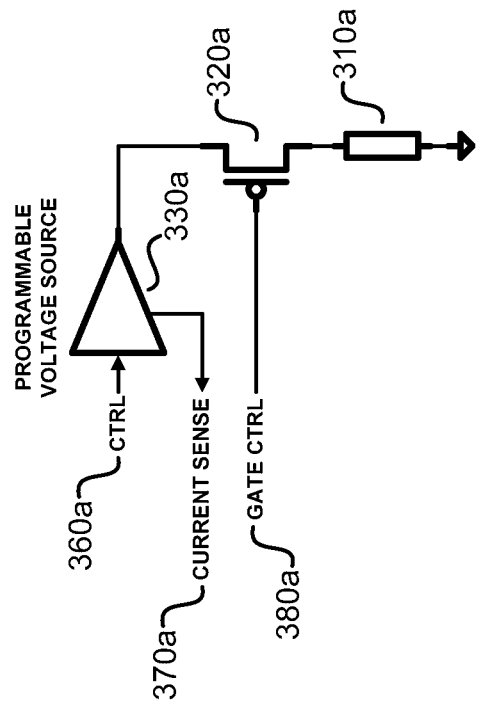
FIGS. 3A-3D are schematics illustrating exemplary programming circuits for programming and reading the state of a resistive change memory cell.

Referring now to FIG. 3A, a first programming circuit is depicted. A programmable voltage source 330a is used to apply a programming voltage across a resistive change memory cell represented by FET device 320a (analogous to the FET devices of FIGS. 1 and 2) and resistive change element 310a (analogous to the resistive change elements of FIGS. 1 and 2). Programmable voltage source 330a is responsive to an external control 360a (supplied, for example, from a software controlled algorithm executed within a microprocessor or microcontroller, or from an FPGA or hardware control circuit) which sets and executes one or more programming pulses. Programmable voltage source 330a also provides a feedback output 370a indicating the current it is supplying during operation. This feedback output 370a can be used to read the state of resistive change element 310a between programming pulses.

Figure 3B:
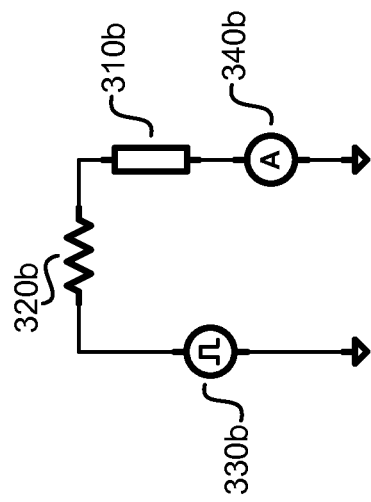

Referring now to FIG. 3B, a second programming circuit is depicted. A pulse generator 330b is placed across a resistive change memory cell represented by fixed resistor 320b (which replaces the FET devices of FIGS. 1 and 2 as a current limiting device) and resistive change element 310b (analogous to the resistive change elements of FIGS. 1 and 2). An ammeter 340b is wired in series with resistive change element 310b. In this way, pulse generator 330b can be used to apply programming pulses while ammeter 340b monitors current through the resistive change element 310b. Within such a circuit, the pulse generator 330b is required to apply both programming pulses (in order to adjust the resistive state of resistive change element 310b) and test voltages (in order to read the resistive state of resistive change element 310b).

Figure 3C:
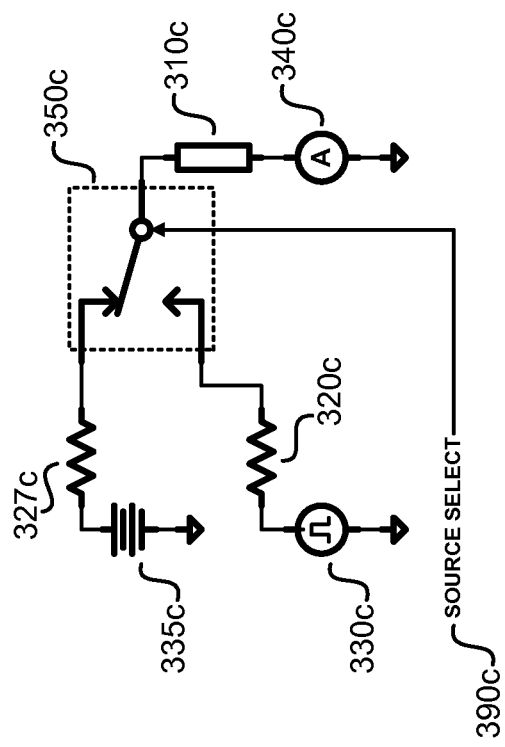

Referring now to FIG. 3C, a third programming circuit is depicted. A pulse generator 330c and a fixed voltage supply 335c are connected through a relay switching device 350c to resistive change element 310c (analogous to the resistive change elements of FIGS. 1 and 2). The relay switching device 350c, responsive to an external control 390c, selects between the pulse generator 330c (which provides programming pulses through fixed resistor 320c) and the fixed voltage supply 335c (which provides test voltages through fixed resistor 327c). As within the circuit of FIG. 3B, an ammeter 340c is wired in series with resistive change element 310c to monitor current through the resistive change element 310c during read cycles.

Figure 3D:
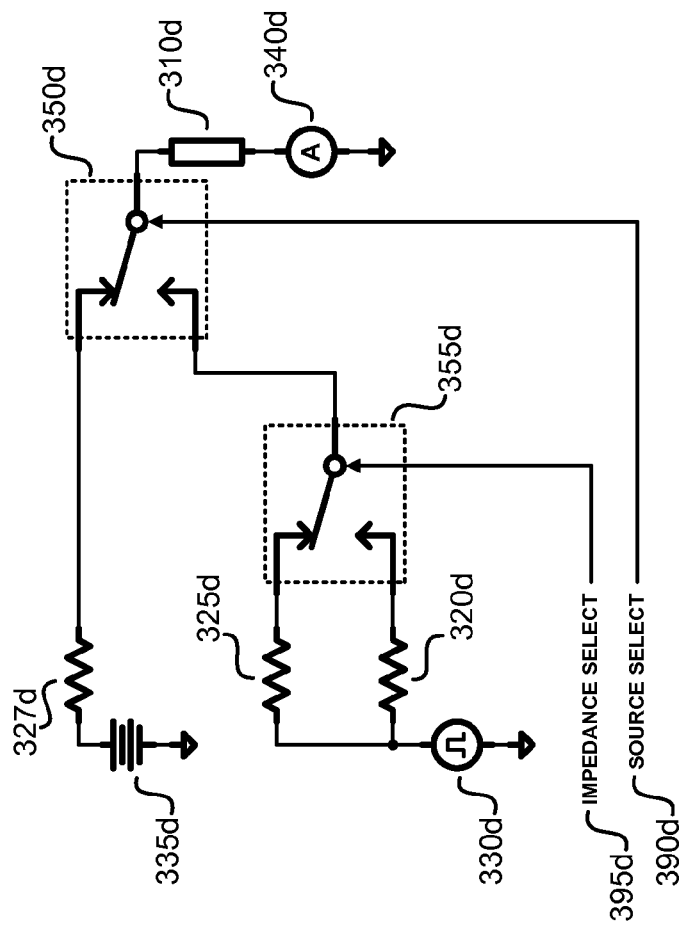

Referring now to FIG. 3D, a fourth programming circuit is depicted. A pulse generator 330d and a fixed voltage supply 335d are connected through a first relay switching device 350d to resistive change element 310d (analogous to the resistive change elements of FIGS. 1 and 2). The relay switching device 350d, responsive to an external control 390d, selects between the pulse generator 330d (which provides programming pulses through one of two fixed resistors 320d or 325d) and the fixed voltage supply 335d (which provides test voltages through fixed resistor 327d). A second relay switching device 355d provides a control to select between a first current limiting resistor 320d and a second current limiting resistor 325d in series with pulse generator 330d. In this way, the value of the current limiting series resistor (analogous to the FET devices of FIGS. 1 and 2) used within a programming operation can be adjusted between programming pulses. As within the circuits of FIGS. 3B and 3C, an ammeter 340d is wired in series with resistive change element 310d to monitor current through the resistive change element 310d during read cycles.

Within the programming of one-bit resistive change memory cells, two types of programming operations are employed. A "set" operation is used to adjust a resistive change element from a high resistive state to a low resistive state. For example, a series of programming pulses, systematically increasing in pulse width and voltage level, are applied to the resistive change element until the resistance of the resistive change element is below a predefined set resistance threshold. A "reset" operation is used to adjust a resistive change element from a low resistive state to a high resistive state. For example, a series of programming pulses, systematically increasing in pulse width and voltage level, are applied to the resistive change element until the resistance is above a predefined reset resistance threshold. Under an aspect of the present disclosure, both operations will include first applying a programming pulse at a specified voltage level and then applying a test voltage to observe any change in resistance. This two step process is repeated until the desired threshold resistance value is crossed.

The voltage levels used for a reset operation may be higher than those used for a set operation, and the programming pulses in a set operation are sometimes applied through a fixed series resistance to limit the current through the resistive change element. The pulse widths and voltage levels used in each operation are selected according to specific applications. For example, the physical dimensions of the resistive change element, the type of resistive change element used, and the specific set and reset threshold values used all factor into the specific voltage level and pulse width of programming pulses applied.

For example, within an exemplary carbon nanotube-based memory cell, wherein a carbon nanotube fabric layer is used as a resistive change element, a set resistance threshold value can be on the order of 1 MΩ and a reset resistance threshold can be on the order of 10 MΩ. In such an application the programming pulses used in a set operation might range from 2V to 4V (applied, for example, through a 500 kΩ fixed series resistance) with pulse widths ranging from 5 µs to 5 ms. In the same application the programming pulses used in a reset operation might range from 4V to 6V with pulse widths ranging from 500 ns to 1000 ns. It should be noted that the preceding example is provided only to illustrate a set of typical set and reset parameters for an exemplary resistive change memory cell. As such, the methods of the present disclosure should not be limited to such parameters.

Hysteresis is typically built into the resistance thresholds within resistive change memory cells in order to allow for an unambiguous read operation. That is, the set resistance threshold value and the reset resistance threshold value are typically offset from each other by some range, providing a range of resistance values between these threshold values for which the resistive change element is neither in a set nor in a reset state. This undefined range is typically referred to as the "grey-zone".

Figure 4:
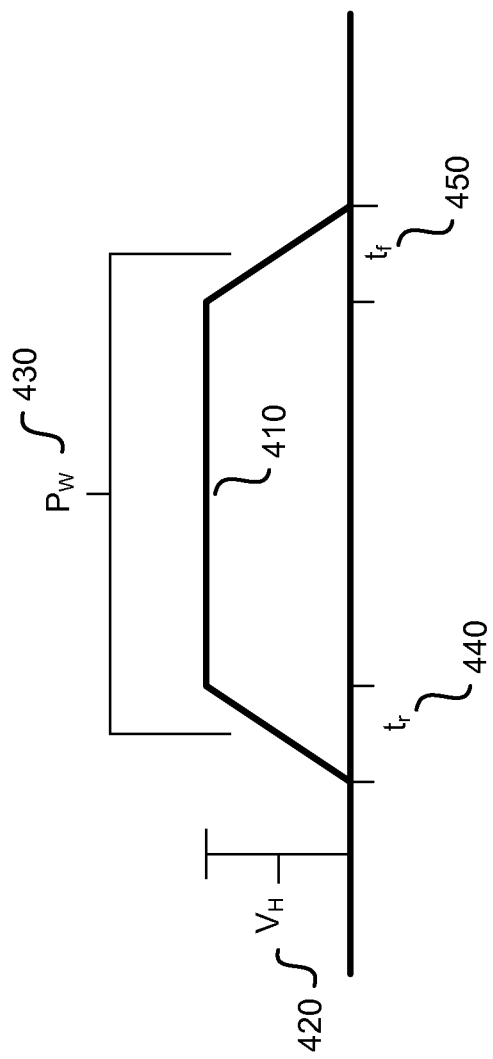
FIG. 4 is an exemplary diagram of a voltage pulse and various properties thereof.

FIG. 4 shows a voltage pulse and various properties thereof. A description of these properties will be useful in understanding further aspects of the present disclosure.

A voltage pulse 410 having a height $V_H$ 420 has a pulse with width $P_W$ 430. This width is measured from midway along the rise time $t_r$ 440 and midway along the fall time $t_f$ 450. Each of these aspects of the voltage pulse—its width, its height, its rise and fall time—can be used as programming parameters in the present disclosure.

Figure 5:
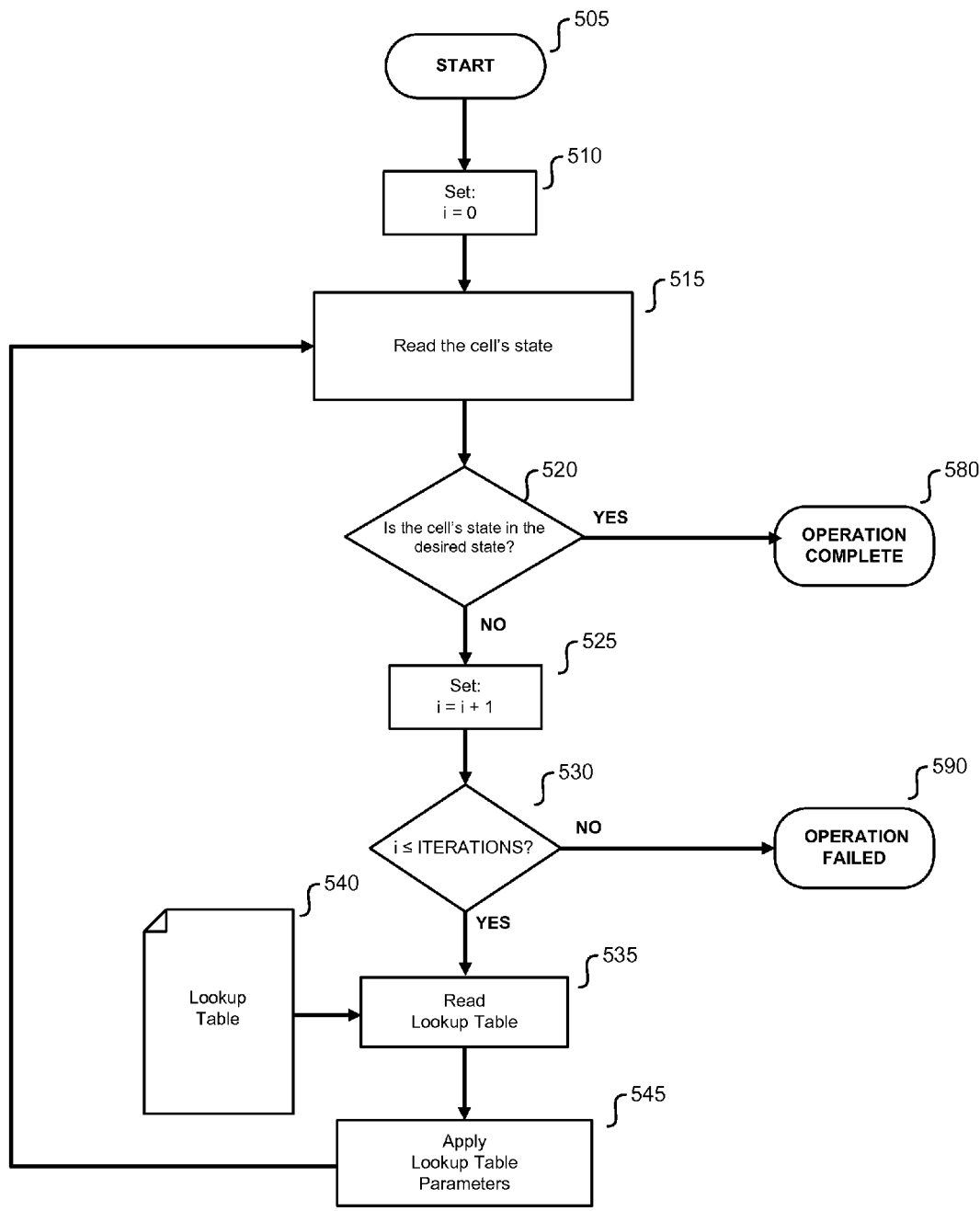
FIG. 5 is a flow chart describing a method for adjusting a resistive change memory cell using a lookup table, according to one aspect of the invention.

FIGS. 5-7 illustrate a method of adjusting a resistive change element. FIG. 5 provides a flow chart serving as an overview of the entire method, including reading the cell's initial programmed state, selecting a programming parameter set from a look up table, and applying stimulus to the resistive change element based on the programming parameter set. FIG. 6 and FIG. 7 illustrate the concept of lookup tables through several examples, each including a set of programming parameters associated with a programmed state.

FIG. 5 is a flow chart for adjusting a resistive change element, according to aspects of the present disclosure.

The memory cell is connected to a programming circuit (such as, but not limited to those depicted in FIGS. 3A-3D and described above), and the process starts at 505. A counting variable, "i," is initialized to zero (step 510). The current through the memory cell ($I_{CELL}$) is measured to inspect the initial state of the memory cell. In step 520, $I_{CELL}$ is evaluated to determine whether it falls within the desired destination state. If $I_{CELL}$ falls within the desired destination state, then the memory cell is now in the desired destination state and the process is concluded. If $I_{CELL}$ does not fall within a desired destination state, the counting variable "i" is incremented by one (step 525) and is compared to the maximum number of permitted iterations ($iter_{max}$). If the counting variable i is greater than the maximum number of iterations, the process fails (step 590). If, on the other hand, the counting variable i is less than or equal to $iter_{max}$, the lookup table 540 is read to obtain programming parameters. For example, these programming parameters might include the voltage height and the pulse width of the programming pulse. These programming parameters, obtained from lookup table 540, are applied to the resistive change memory cell (step 545) and the method begins anew, measuring the current through the memory cell.

It should be noted that while the algorithm depicted in FIG. 5 and described in detail above describes a specific process to illustrate a programming operation, the methods of the present disclosure should not be limited to this specific example. Indeed, it will be clear to those skilled in the art that the programming operation detailed in FIG. 5 could be adjusted in a plurality of ways to optimize a programming operation for a specific application.

The preceding description of the programming operation process is only representative and not otherwise limited to the specific illustrative parameters detailed.

FIG. 6A shows a first exemplary lookup table used to significantly reduce the number of steps for a set operation.

This particular look up table has three columns. Column 610a corresponds to the initial programmed state, current, and serves as the lookup index for the other columns, which serve as programming parameters. The other columns indicate voltage height 620a necessary and pulse width 630a.

Under alternative aspects of the present disclosure, other columns are possible though not depicted here. Such columns could serve as programming parameters such as, but not limited to, rise time, fall time, series resistance, and supply current. Additionally, environmental factors or other stimulus could be used as columns; such as, but not limited to, temperature or radiation. Furthermore, other primary columns are also possible—such as, but not limited to, a lookup table based on resistance or voltage.

FIG. 6B shows a second exemplary lookup table used to significantly reduce the number of steps for a set operation.

This particular look up table has three columns. Column 610b corresponds to the initial programmed state, resistance, and serves as the lookup index for the other columns, which serve as programming parameters. The other columns indicate voltage height 620b and pulse width 630b.

Under alternative aspects of the present disclosure, other columns are possible though not depicted here. Such columns could serve as programming parameters such as, but not limited to, rise time, fall time, series resistance, and supply current. Additionally, environmental factors or other stimuli could be used as columns; such as, but not limited to, temperature or radiation. Furthermore, other primary columns are also possible—such as, but not limited to, a lookup table based on resistance or voltage.

FIG. 6C shows a third exemplary lookup table used to significantly reduce the number of steps for a set operation.

This particular look up table has five columns. Column 610c corresponds to the initial programmed state, current, and serves as the lookup index for the other columns, which serve as programming parameters. The other columns indicate the voltage height 620c, pulse width 630c, rise time 640c for that pulse, and series resistance 650c.

Under alternative aspects of the present disclosure, other columns are possible though not depicted here. Such columns could serve as programming parameters such as, but not limited to, fall time and supply current. Additionally, environmental factors or other stimuli could be used as columns; such as, but not limited to, temperature or radiation. Furthermore, other primary columns are also possible—such as, but not limited to, a lookup table based on resistance or voltage.

FIG. 6D shows a fourth exemplary lookup table used to significantly reduce the number of steps for a reset operation.

This particular look up table has three columns. Column 610d corresponds to the initial programmed state, current, and serves as the lookup index for the other columns, which serve as programming parameters. The other columns indicate voltage height 620d and pulse width 630d.

Under alternative aspects of the present disclosure, other columns are possible though not depicted here. Such columns could serve as programming parameters such as, but not limited to, rise time, fall time, series resistance, and supply current. Additionally, environmental factors or other stimuli could be used as columns; such as, but not limited to, temperature or radiation. Furthermore, other primary columns are also possible—such as, but not limited to, a lookup table based on resistance or voltage.

FIG. 6E shows a fifth exemplary lookup table used to significantly reduce the number of steps necessary for a reset operation.

This particular look up table has three columns. Column 610e corresponds the initial programmed state, resistance, and serves as the lookup index for the other columns, which serve as programming parameters. The other columns indicate the voltage height 620e and pulse width 630e.

Under alternative aspects of the present disclosure, other columns are possible though not depicted here. Such columns could serve as programming parameters such as, but not limited to, rise time, fall time, series resistance, and supply current. Additionally, environmental factors or other stimuli could be used as columns; such as, but not limited to, temperature or radiation. Furthermore, other primary columns are also possible—such as, but not limited to, a lookup table based on resistance or voltage.

FIG. 6F shows a sixth exemplary lookup table used to significantly reduce the number of steps necessary for a reset operation.

This particular look up table has five columns. Column 610f corresponds to the initial programmed state, current, serving as the lookup index for the other columns, which serve as programming parameters. The other columns indicate voltage height 620f, pulse width 630f, a rise time 640f for the pulse, and a series resistance 650f.

Under alternative aspects of the present disclosure, other columns are possible though not depicted here. Such columns could serve as programming parameters such as, but not limited to, fall time, and supply current. Additionally, environmental factors or other stimuli could be used as columns; such as, but not limited to, temperature or radiation. Furthermore, other primary columns are also possible—such as, but not limited to, a lookup table based on resistance or voltage.

FIG. 7A shows an exemplary general lookup table used to significantly reduce the number of steps for a reset operation. It is analogous to FIG. 6D.

FIG. 7A shows three sub-tables: an operation sub-table 710a, a state sub-table 740a, and a programming parameter sub-table 770a. The operation sub-table 710a maps which programming parameter for transitioning from one state to another. The state sub-table 740a maps the states in the operation sub-table 710a to measured states (e.g. current, resistance, etc.). The programming parameter sub-table 770a maps the programming parameters in the operation sub-table 710a to applicable programming parameters (e.g. voltage height, pulse width, etc.).

The operation sub-table 710a provides the programming parameter to transition from a source state to a destination state. A first column, the source state column 715a, lists possible source states for the resistive change element. A second column, the destination state column 720a, lists possible destination states for the resistive change element. A third column, the programming parameter 725a, lists the programming parameter for switching the resistive change element from the source state to the destination state.

The state sub-table 740a provides the appropriate measured state, in this case resistance, for each named state in the operation sub-table 710a. A first column, the name column 750a, lists the names of states that are used in the operation sub-table 710a in columns 715a and 720a. A second column, the state column 760a, lists the range of measured state for that named state. Here, because the measured state is resistance, the state column 760a lists resistance ranges to pair with the named states.

The programming parameter sub-table 770a provides the programming parameters for each named programming parameter in the operation sub-table 710a. A first column, the name column 775a, lists the names of programming parameters that are used in the operation sub-table 710a in column 725a. Second and third columns, 780a and 785a, respectively, detail various programming parameters for each named programming parameter. Here the columns list voltage height and pulse width, but this is for illustrative purposes, as many other programming parameters could be used, such as, but not limited to, rise time, fall time, series resistance, and supply current. Additionally, environmental factors or other stimuli could be used as columns; such as, but not limited to, temperature or radiation.

In its entirety, FIG. 7A recreates FIG. 6D as a general lookup table. The advantage of a general lookup table is that it can encapsulate any number of operations, as opposed to being limited to just representing a single operation (e.g. set or reset). Here, FIG. 7A still only encapsulates the reset operation, but the next figure, FIG. 7B, shows a multi-operation general lookup table.

FIG. 7B shows an exemplary general lookup table used to significantly reduce the number of steps necessary for any operation. FIG. 7B lists operations for switching the resistive change element into a reset state and further provides a mapping from any state to any other. This includes both multi-bit resistive change elements (e.g. a two-bit memory cell, as illustrated in FIG. 7B) as well as the possibility of providing mappings from non-representative states (e.g. moving between different zones within buffers).

FIG. 7B contains three sub-tables: an operation sub-table 710b, a state sub-table 740b, and a programming parameter sub-table 770b. The operation sub-table 710b maps which programming parameter for transitioning from one state to another. The state sub-table 740*b* maps the states in the operation sub-table 710*b* to measured states (e.g. current, resistance, etc.). The programming parameter sub-table 770*b* maps the programming parameters in the operation sub-table 710*b* to applicable programming parameters (e.g. voltage height, pulse width, etc.).

The operation sub-table 710*b* provides the programming parameter to transition from a source state to a destination state. A first column, the source state column 715*b*, lists source states that the resistive change element could be in. A second column, the destination state column 720*b*, lists destination states the resistive change element could be switched to. A third column, the programming parameter 725*b*, lists the programming parameter to apply to switch the resistive change element from the source state to the destination state.

The state sub-table 740*b* provides the measured state, in this case resistance, for each named state in the operation sub-table 710*b*. A first column, the name column 750*b*, lists the names of states that are used in the operation sub-table 710*b* in columns 715*b* and 720*b*. A second column, the state column 760*b*, lists the range of measured state for that named state. Here, because the measured state is resistance, the state column 760*b* lists resistance ranges to pair with the named states.

The programming parameter sub-table 770*b* provides the programming parameters for each named programming parameter in the operation sub-table 710*b*. A first column, the name column 775*b*, lists the names of programming parameters that are used in the operation sub-table 710*b* in column 725*b*. Second and third columns, 780*b* and 785*b*, detail various programming parameters for each named programming parameter. Here the columns list voltage height and pulse width, but this is for illustrative purposes, as many other programming parameters could be used, such as, but not limited to, rise time, fall time, series resistance, and supply current. Additionally, environmental factors or other stimuli could be used as columns; such as, but not limited to, temperature or radiation.

FIG. 7B illustrates an exemplary general lookup table, encapsulating any number of operations. Using the exemplary general lookup table in FIG. 7B the exemplary two-bit resistive change element can switch from any state to any other, including non-representative states within buffer regions. Using the exemplary general lookup table concept, a multi-bit resistive change element with more than four representative states can be implemented.

Figure 8:
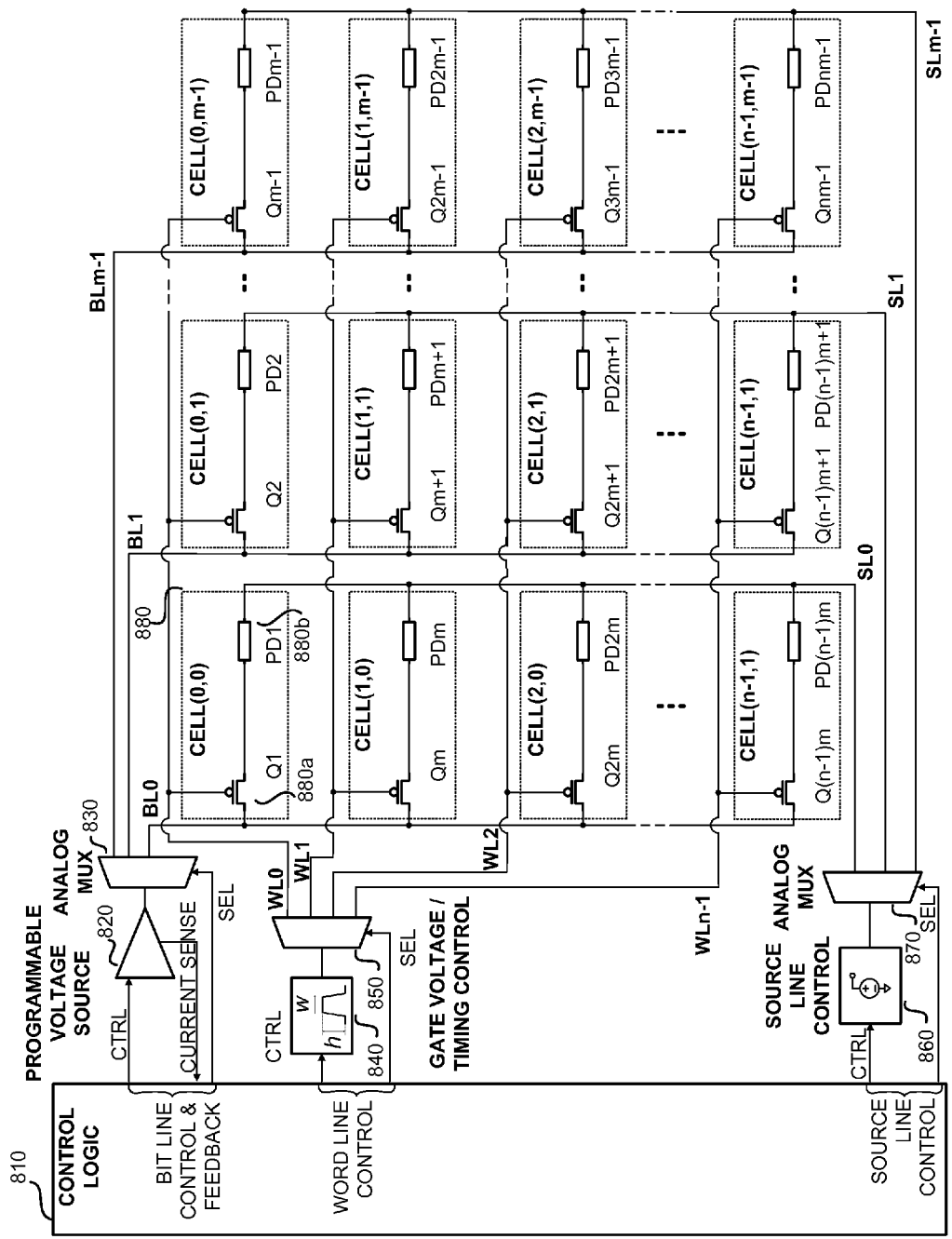
FIG. 8 is a block diagram of an exemplary resistive change memory array including programming and sensing structures well suited for use within the methods of the present disclosure, according to aspects of the present invention.

FIG. 8 shows an exemplary resistive change memory cell array and associated programming circuit and associated processing element for use with the methods of the present disclosure. A plurality of resistive change memory cells 880 are arranged into an array of m columns and n rows. Each resistive change memory cell 880 is comprised of a series combination of an FET device 880*a* and a resistive change element 880*b*, as is detailed in FIGS. 1 and 2 and discussed in detail above.

The programming circuit selects the appropriate memory cell and applies a programming pulse to that cell. A first plurality of bit lines (BL0-BLm-1), analogous to the bit lines in FIGS. 1 and 2, are run vertically through the array, electrically coupling the drain terminals of the FET devices 880*a* in each column of memory cells 880. A second plurality of word lines (WL0-WLn), analogous to the word lines in FIGS. 1 and 2, are run horizontally through the array, electrically coupling the gate terminals of the FET devices 880*a* in each row of memory cells 880. A third plurality of source lines (SL0-SLm-1), analogous to the source lines in FIGS. 1 and 2, are run vertically through the array, electrically coupling the second terminal of the resistive change elements 880*b* within each column of memory cells 880.

A first analog multiplexer 830, responsive to a selection control from control logic block 810, electrically couples a voltage provided programmable voltage source 820 to one of the first plurality of bit lines (BL0-BLm-1). Programmable voltage source 820, similar to the programming circuit detailed in FIG. 3A, is responsive to a selection control provided by control logic block 810 and can be used to provide a plurality of programming pulses and test voltages as described in the discussions of FIG. 5. It also includes a current sense feedback line, which provides the control logic block 810 with a reading for the current being supplied to the selected bit line. As will be show below, this current sense feedback line can be used to measure the cell current ($I_{CELL}$) of a memory cell 880 being programmed after each programming pulse is applied.

A second analog multiplexer 850, responsive to a selection control from control logic block 810, electrically couples a gate control signal (provided by gate voltage/timing control block 840) to one of the second plurality of word lines (WL0-WLn-1). Gate voltage/timing control block 840, responsive to a control signal from control logic block 810, provides a gate control voltage to a selected word line, allowing the FET device 880*a* in a selected memory cell to conduct. In some cases, depending on the requirements of the programming parameters being applied, this gate voltage will open the FET device 880*a* within a selected memory cell completely, essentially electrically coupling the resistive change element 880*b* of the selected memory cell to programmable voltage source 810. In other cases, this gate voltage will bias the gate of the FET device 880*a* within a selected memory cell such that the FET device 880*a* serves to limit the current through resistive change element 880*b*.

A third analog multiplexer 870, responsive to a selection control from control logic block 810, electrically couples one of the third plurality of source lines (SL0-SLm-1) to source line control block 860. Source line control block 860, responsive to a control signal from control logic block 810, can be used to either ground or provide an offset voltage to a selected source line. In some cases, it may be desirable to provide an offset voltage on a selected source line such that the effective voltage level of the programming pulse provided the resistive change element 880*b* in a selected memory cell 880 is reduced.

By providing a programming pulse on a single bit line (selected via first analog multiplexer 830), a gate voltage on a single word line (selected via second analog multiplexer 850), and providing a path to ground through—or, alternatively an offset voltage on—a single source line (selected via third analog multiplexer 870), a single memory cell can be selected and arranged in a programming circuit similar to that detailed in FIG. 3A.

Processing element control logic block 810 can be implemented through a variety of structures according to specific applications. For example, FPGAs, PLDs, microcontrollers, logic circuits, or a software program executing on a computer could all be used to execute the programming algorithm detailed in FIG. 5 and provide the necessary control and selection signals discussed above. Furthermore, a combination of hardware and software, or software alone, or hardware alone, could be used to implement the processing element control logic block of 810. In this way, the system detailed in FIG. 8 can reliably program any memory cell 880 within the array using the methods of the present disclosure.

Although FIG. 8 depicts a specific memory cell array and associated programming circuitry, the methods of the present disclosure should not be limited to this specific example. Indeed, it will be clear to those skilled in the art that array and circuitry detailed in FIG. 8 could be adjusted in a plurality of ways to optimize them for a specific application.

Figure 9:
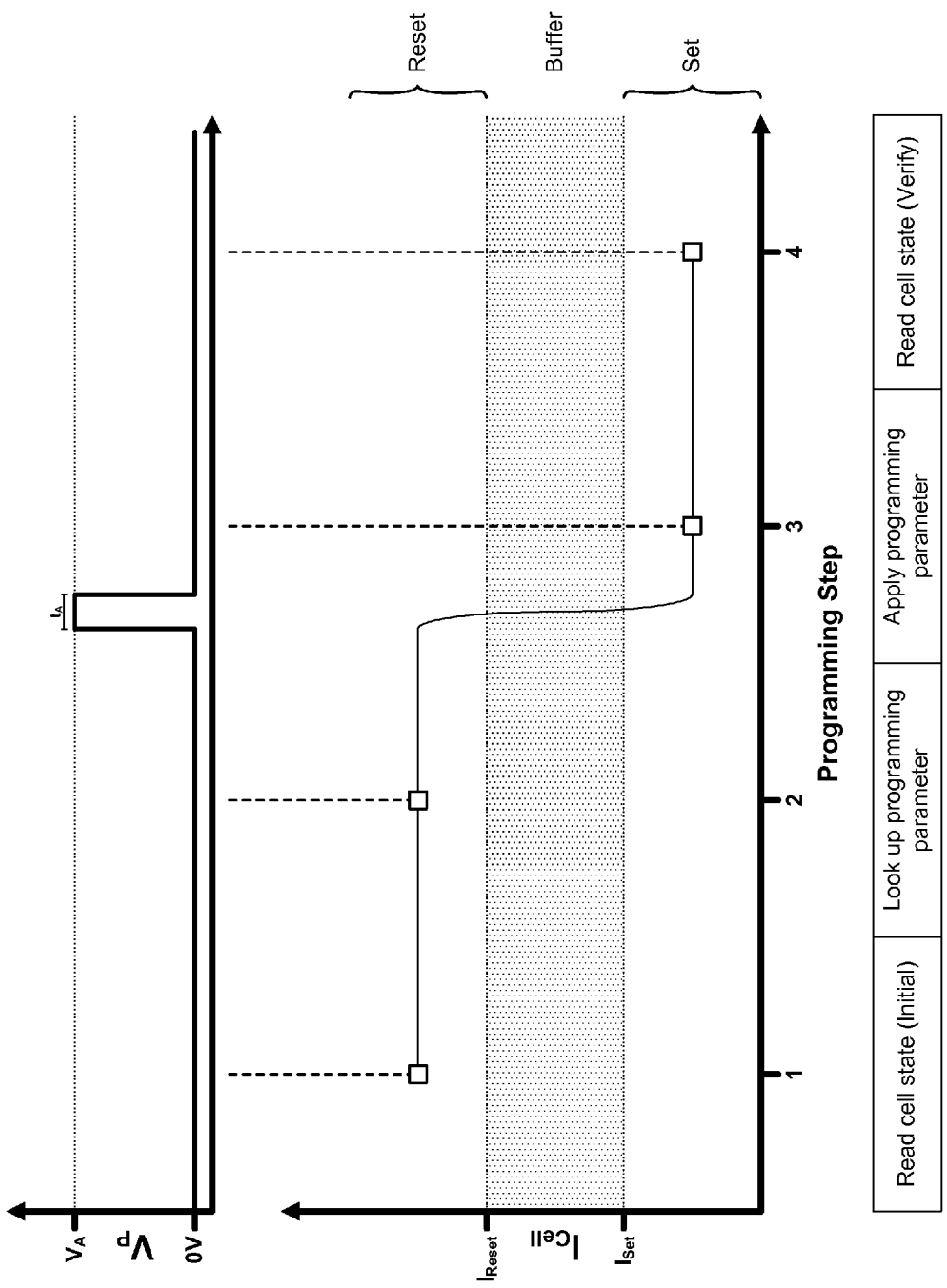
FIGS. 9 and 10 show exemplary waveform diagrams for adjusting a resistive change memory cell according to aspects of the present invention.

FIG. 9 is a waveform diagram illustrating a set operation on a one-bit resistive change memory cell according to the algorithm detailed in FIG. 5. The upper waveform diagram in FIG. 9 is a time domain plot of the programming pulse ($V_P$) applied to the memory cell as determined by the algorithm of FIG. 5. The lower waveform diagram in FIG. 9 is a plot of the current read after each programming pulse is applied to the one-bit resistive change memory cell.

The lower waveform diagram has two regions labeled: reset and set. The reset region corresponds to the reset state and the set region corresponds to the set state. The diagram also has a buffer region between the reset and set regions, corresponding to a buffer zone between the two valid states of the cell.

Programming step 1 on the horizontal axis of the waveform of FIG. 9 corresponds to process step 515 in FIG. 5 (measuring the initial programmed state, current, through the memory cell before any programming pulses are applied). Programming step 2 corresponds to process step 535 in FIG. 5 (looking up the programming parameter by reading the lookup table). The algorithm queries the lookup table with its current state (reset), its desired state (set) and receives appropriate programming parameters: a voltage pulse of height $V_P$ and duration $t_P$. Programming step 3 corresponds to process step 545 (applying the programming parameters to the resistive change element). Here, the voltage pulse of height $V_P$ and duration $t_p$ is applied to the memory cell. Programming step 4 corresponds to the second visit to process step 515, process step 520, and process step 580 (read the cell state again, verify it is in the desired state, and then complete the operation). Here the cell has been successfully switched to the set state.

The programming steps in FIG. 9 are for illustrative purposes and do not serve as limitations. Several programming steps could occur in one actual operation cycle. For example, programming steps 3 and 4 could occur simultaneously.

In FIG. 9, the cell switches from its initial reset state to a set state in just one programming operation, the pulse in programming step 3. The particular parameters this programming operation uses are provided by the lookup table in programming step 2.

Figure 10:
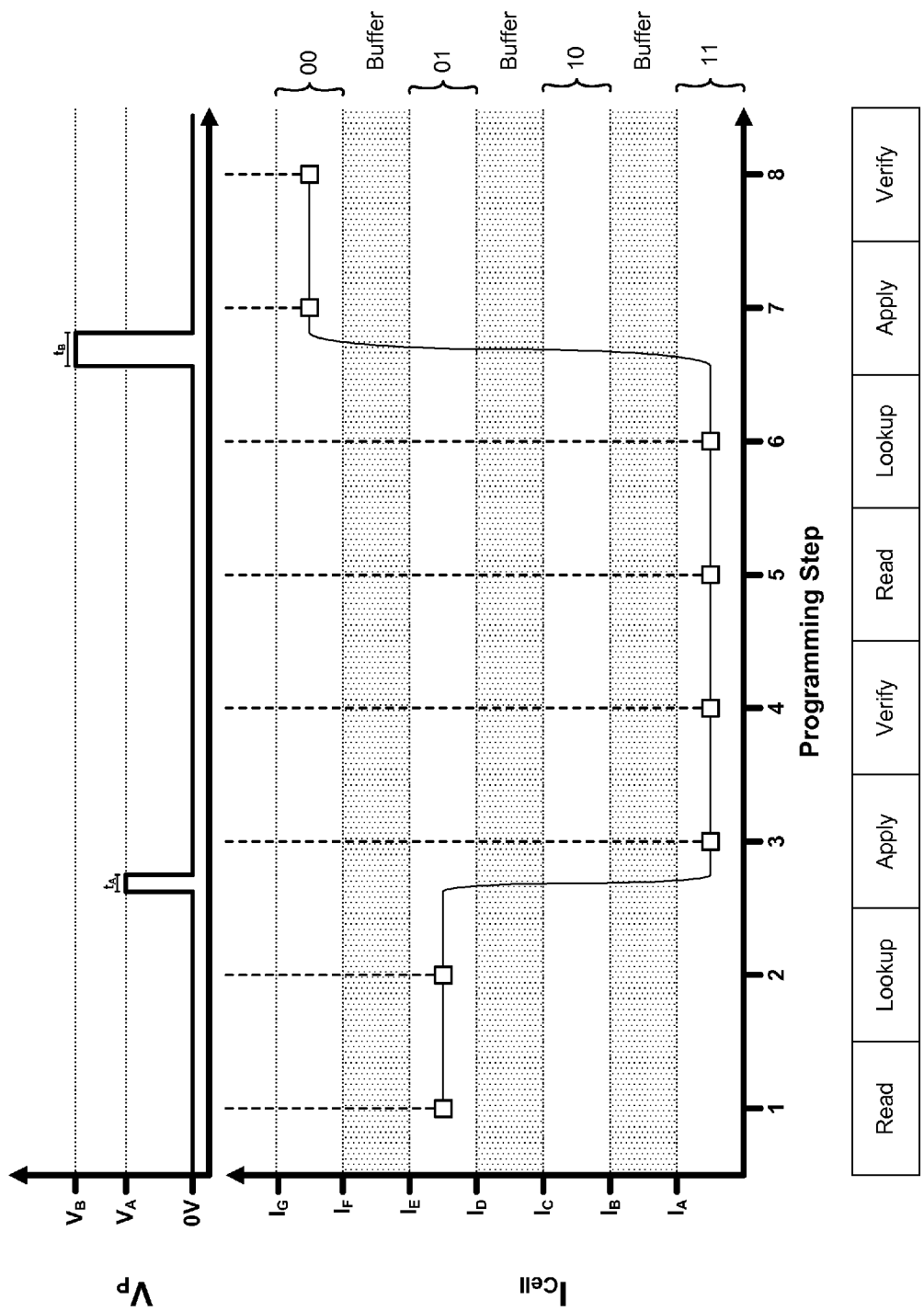

FIG. 10 is a waveform diagram illustrating two state change operations on a two-bit resistive change memory cell according to the algorithm detailed in FIG. 5. The upper waveform diagram in FIG. 10 is a time domain plot of the programming pulse ($V_P$) applied to the memory cell as determined by the algorithm of FIG. 5. The lower waveform diagram in FIG. 10 is a plot of the current read after each programming pulse is applied to the two-bit resistive change memory cell.

The lower waveform diagram has several regions, corresponding to bit values of the two-bit memory cell. Three buffer regions lie between the four bit regions, corresponding to buffer zones between the four valid states of the cell.

Programming steps 1 through 4 depict the cell switching from the state 01 to the state 11. Programming step 1 on the horizontal axis of the waveform of FIG. 10 corresponds to process step 515 in FIG. 5 (measuring the initial programmed state, current, through the memory cell before any programming pulses are applied). Programming step 2 corresponds to process step 535 in FIG. 5 (looking up the programming parameter by reading the lookup table). The algorithm queries the lookup table with its current state (01) and its desired state (11) and receives appropriate programming parameters, here a voltage pulse of height $V_A$ and duration $t_A$. Programming step 3 corresponds to process step 745 (applying the programming parameters to the resistive change element). Here, the voltage pulse of height $V_A$ and duration $t_A$ is applied to the memory cell. Programming step 4 corresponds to the second visit to process step 715, process step 720, and process step 780 (read the cell state again, verify it is in the desired state, and then complete the operation). Here, the cell has been successfully switched to state 11.

Programming steps 5 through 8 depict the cell switching from the state 01 to the state 00. Programming step 5 on the horizontal axis of the waveform of FIG. 10 corresponds to process step 515 in FIG. 5 (measuring the initial programmed state, current, through the memory cell before any programming pulses are applied). Programming step 6 corresponds to process step 535 in FIG. 5 (looking up the programming parameter by reading the lookup table). The lookup table is queried based on a current state (01) and a desired state (11) and programming parameters are provided, here a voltage pulse of height $V_B$ and duration $t_B$. Programming step 7 corresponds to process step 745 (applying the programming parameters to the resistive change element). Here, the voltage pulse of height $V_B$ and duration $t_B$ is applied to the memory cell. Programming step 8 corresponds to the second visit to process step 715, process step 720, and process step 780 (read the cell state again, verify it is in the desired state, and then complete the operation). Here, the cell has been successfully switched to state 00.

The programming steps in FIG. 10 are for illustrative purposes and do not serve as limitations. Several programming steps could occur in one actual operation cycle. For example, programming steps 4 and 5 can occur simultaneously.

In FIG. 10, the cell switches from its initial state of 01 to a state of 11 in just one programming operation, the pulse in programming step 3. It further switches from the state of 11 to the state of 00 in another single programming operation, the pulse in programming step 7. The lookup table provides the programming parameters for these operations in programming step 2 and programming step 6, respectively.

Figure 11:
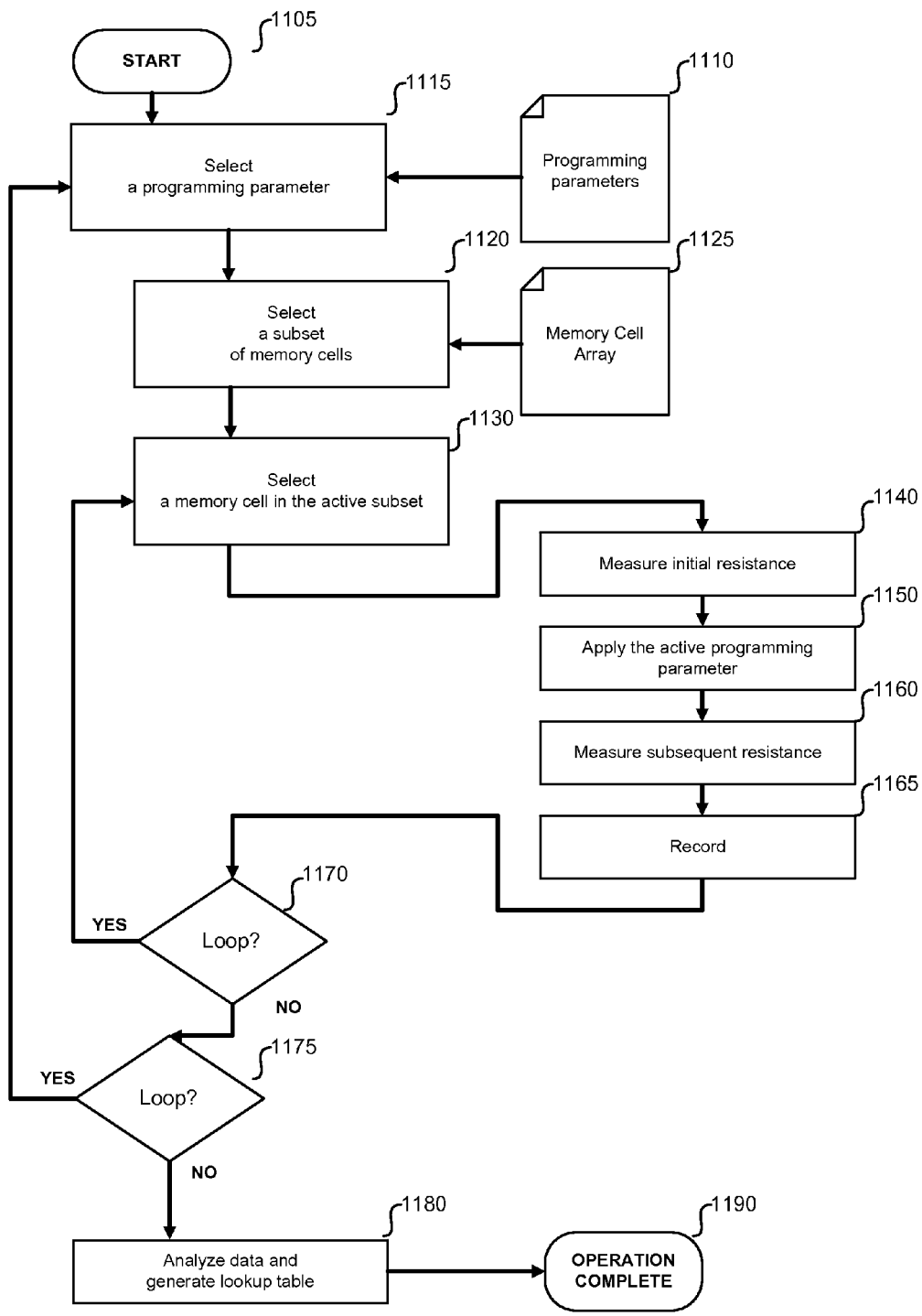
FIG. 11 is a flow chart describing an algorithm for characterizing a memory cell array so as to generate a lookup table.

Under another aspect of the present disclosure a method of generating a lookup table of programming parameters for adjusting a resistive change memory array is provided, as illustrated in FIGS. 11 and 12. FIG. 11 provides a flow chart serving as an overview of the entire method. FIG. 11 illustrates iterating through a set of programming parameters and over a memory cell array, and for each cell, measuring an initial programmed state, applying a programming parameter, measuring a subsequent state, and recording the initial state, programming parameter applied, and subsequent state. FIG. 12, through a set of process diagrams, illustrates a method of analyzing the data recorded in part of FIG. 11 to generate a lookup table.

FIG. 11 describes the steps for characterizing a memory cell area to generate a lookup table.

At the start of the process 1105, a set of programming parameters 1110 is iterated through in step 1115. For each programming parameter, in step 1120, a subset of memory cells is selected from the memory cell array 1125. For each memory cell thus selected in step 1130, the initial resistance 1140 is measured, then the actively selected programming parameter 1150 is applied, and then the subsequent resistance 1160 is measured. This process loops through each of the memory cells 1170 and through each of the programming parameters 1175. At the end of the process 1180, the initial resistance, subsequent resistance, and programming parameters are analyzed to generate a lookup table completing the characterization process (step 1190).

Under alternative aspects of the present disclosure, the process of FIG. 11 could measure a different state than resistance, e.g. current.

Under alternative aspects of the present disclosure, the subsets of memory cells from the memory cell array are non-overlapping, so no subset of memory cells shares any memory cells with any other subset of memory cells. Alternatively, the subsets of memory cells may be overlapping, so a subset of memory cells may share memory cells with another subset of memory cells.

It should be noted that while the process of FIG. 11 describes a specific process in order to illustrate a characterization operation, the methods of the present disclosure should not be limited to this specific example. Indeed, it will be clear to those skilled in the art that the characterization operation detailed in FIG. 11 could be adjusted in a plurality of ways to optimize a characterization operation for a specific application. Specifically, the process of FIG. 11 could be implemented in hardware, in software, or in a combination of hardware and software.

It is preferred, then, that the preceding description of a characterization operation process be representative and inclusive of these variations and not otherwise limited to the specific illustrative parameters detailed.

Figure 12A:
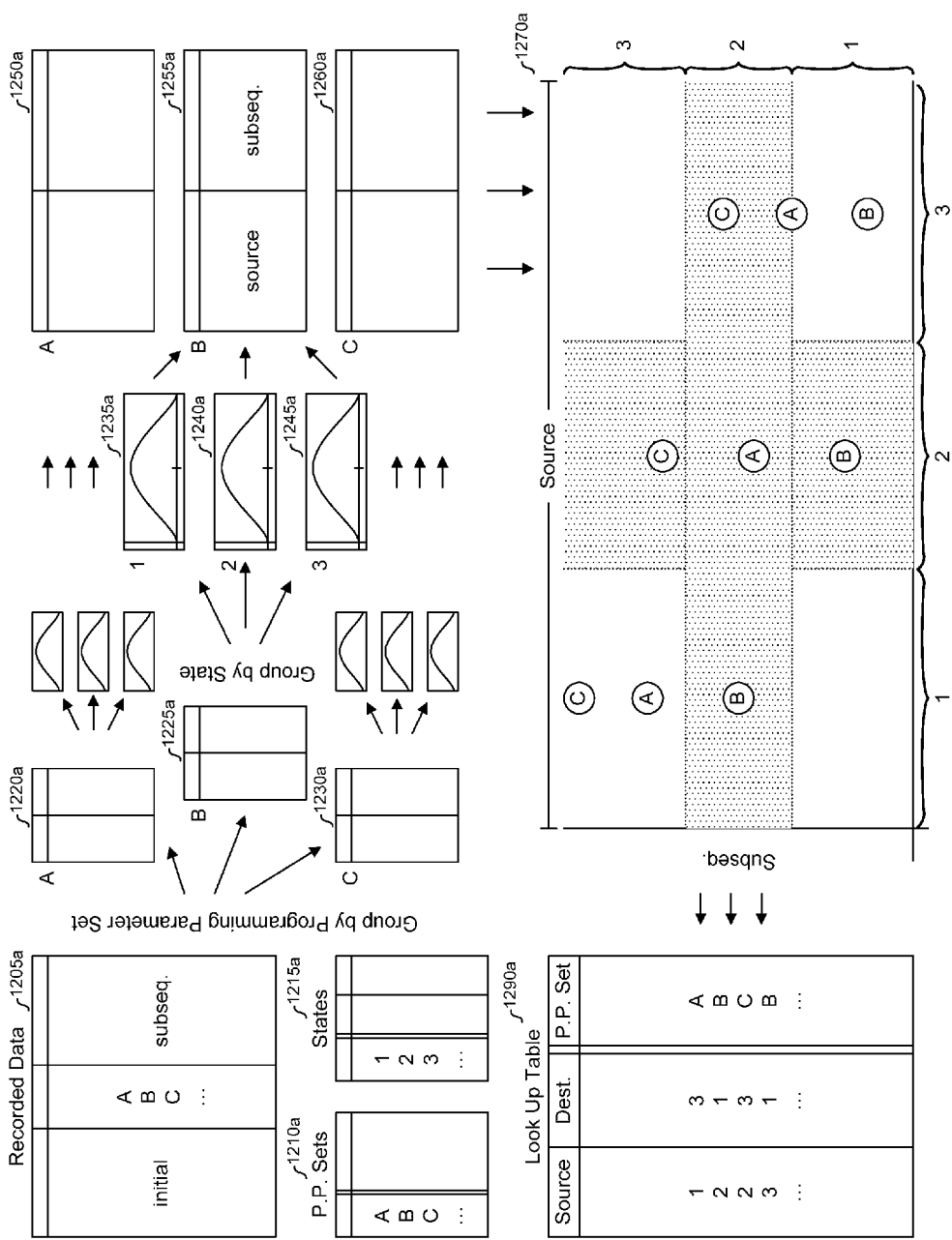
FIGS. 12A-12D are a set of process diagrams for analyzing recorded data from a memory cell array so as to generate a lookup table.
Figure 12B:
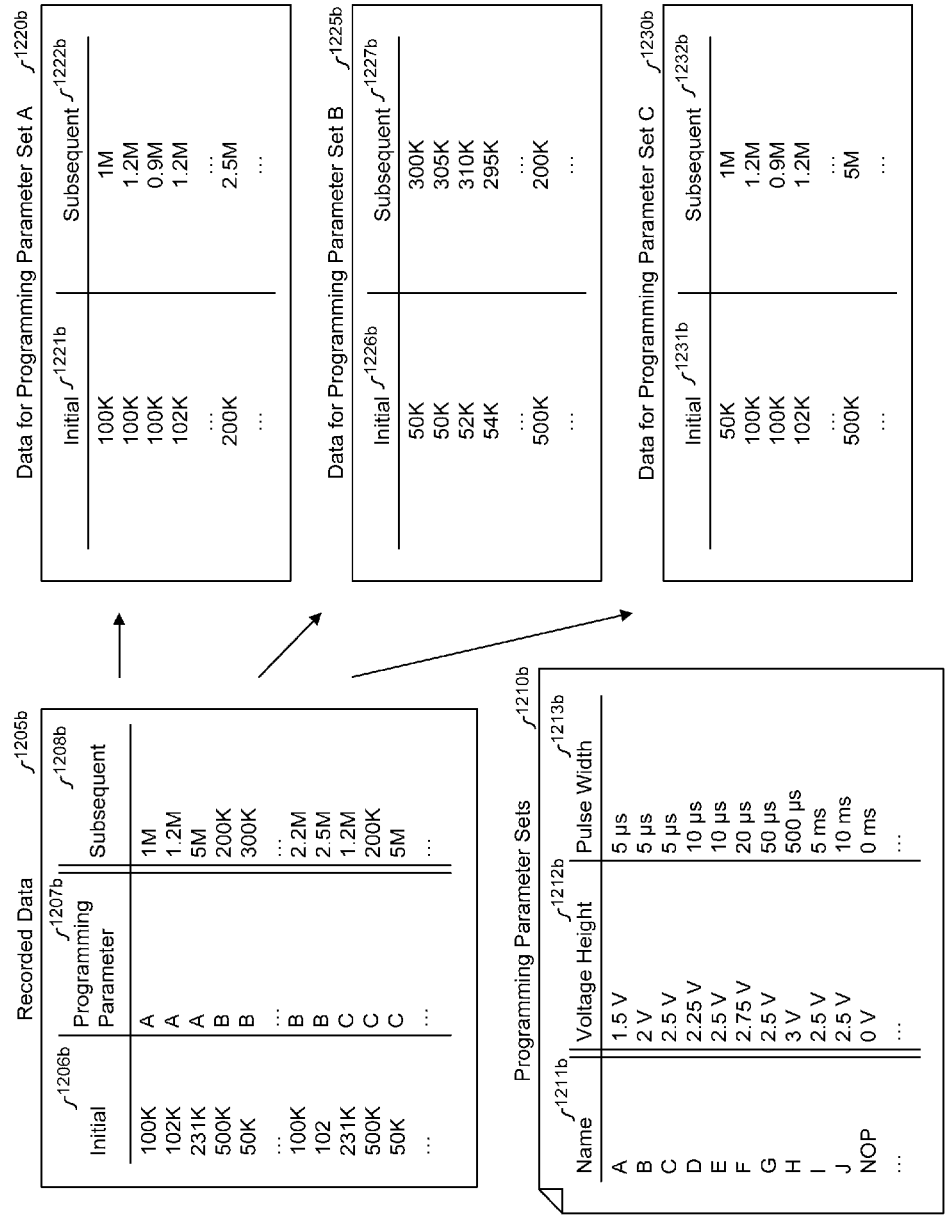
Figure 12C:
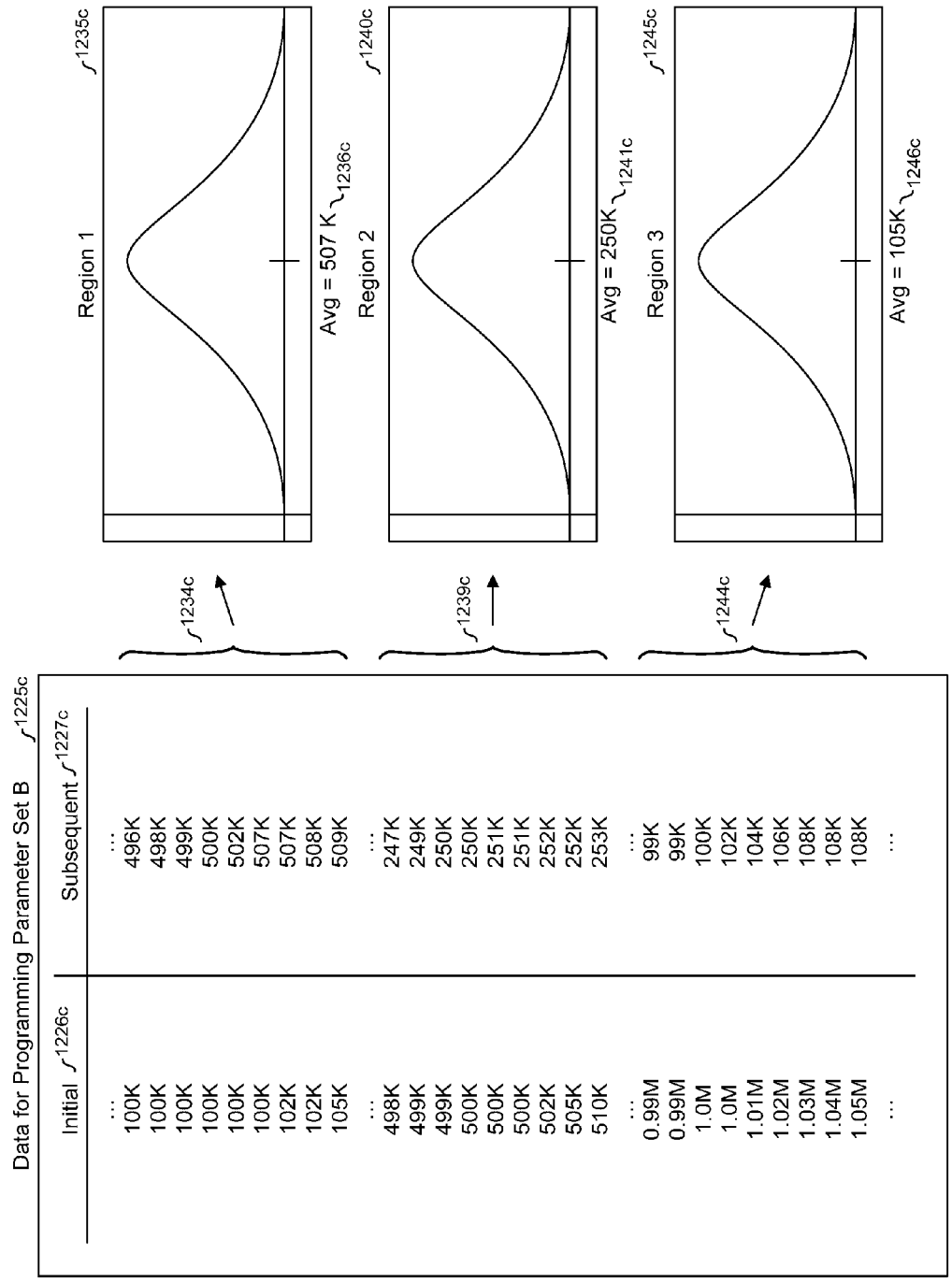
Figure 12D:
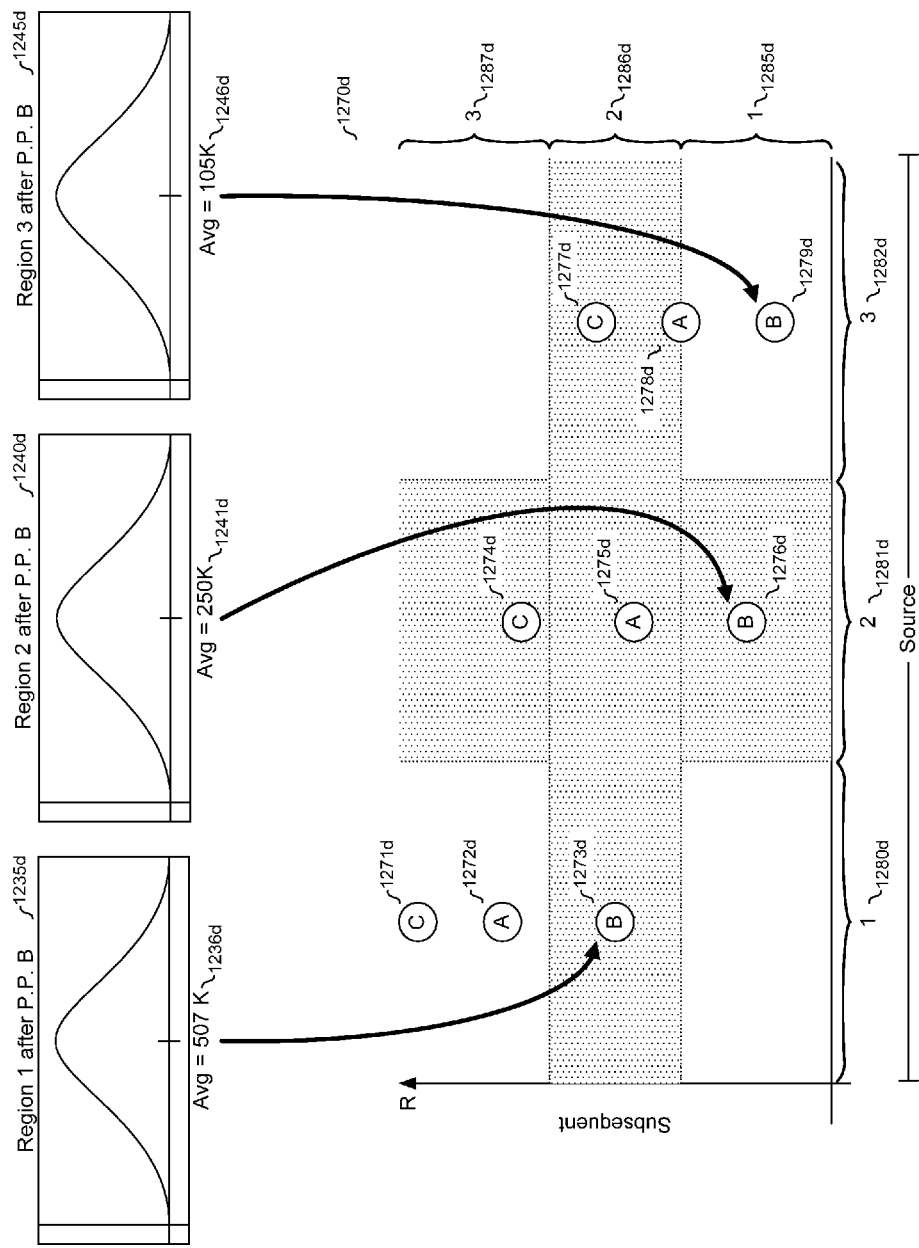

FIGS. 12A-12D are a set of process diagrams for analyzing recorded data from a memory cell array so as to generate a lookup table. FIG. 12A provides an overview of the entire process. FIG. 12B provides a detailed look at the early steps of the process depicted in FIG. 12A. FIG. 12C provides a detailed look at further steps of the process depicted in FIG. 12A. FIG. 12D provides a detailed look at the final steps of the process depicted in FIG. 12A.

FIG. 12A illustrates the details a method for analyzing recorded data from a memory cell array so as to generate a lookup table. The method of FIG. 12A can be implemented, for example, during FIG. 11's analyze data and generate lookup table step, 1180.

FIG. 12A begins with recorded data 1205a, generated as described in FIG. 11. This recorded data contains a reading of an initial state of a memory cell, a programming parameter applied to the memory cell, and a reading of a subsequent state of a memory cell. For example, the initial and subsequent states could measure the resistance of a memory cell.

FIG. 12A also depicts sets of programming parameters 1210a. This table can be analogous to the programming parameter sub-table 670b of FIG. 6B. The sets of programming parameters 1210a contain definitions of the various programming parameters, including a name for each parameter and various programming parameters, such as voltage height and pulse width. For purposes of illustration, FIG. 12A only depicts three programming parameters: A, B, and C.

FIG. 12A also depicts a table of states 1215a. This table is analogous to the state sub-table 640b of FIG. 6B. The set of states defines various states and the resistance ranges that correspond to each state. (Resistance is used as an example here, other state defining regions, e.g. current, are possible). For purposes of illustration, FIG. 12A only depicts three states: 1, 2, and 3.

Under an aspect of the present disclosure, the recorded data 1205a, programming parameter sets 1210a, and table of states 1215a, are grouped by programming parameter set. Each row in the recorded data table that uses programming parameter A goes into the table for programming parameter A 1220a. Each row in the recorded data table that uses programming parameter B goes into the table for programming parameter B 1225a. Each row in the recorded data table that uses programming parameter C goes into the table for programming parameter C 1230a. This process step is examined in greater detail in FIG. 12B.

After the recorded data are grouped by programming parameter set, data are then grouped by source state. All rows with an initial state that falls within the region of source state 1 are grouped together. Similarly, all rows with an initial state that falls into the region of source states 2 and 3 are also grouped together. This results in the graphs 1235a, 1240a, and 1245a. This process step is examined in greater detail in FIG. 12C.

Next the data is merged back together, creating tables of state to state transitions for each programming parameter, here tables 1250a, 1255a, and 1260a for programming parameters A, B, and C, respectively. This data is then plotted on a state-to-state transition chart 1270a. This process step is examined in greater detail in FIG. 12D.

The lookup table 1290a is assembled by looking at each source-destination pairing and selecting the programming parameter that provides the best transition for each pairing. For example, in FIG. 12A, the algorithm selects programming parameter A for the transition from the source state 1 to the destination state B. Looking at the state-to-state transition chart 1270a, programming parameter A provides the best transition for that state pairing. Programming parameter B, for example, will not transition to state 3 when starting from state 1. Instead it will transition to state 2. This information is encoded in the lookup table, generating a general lookup table akin to that depicted in FIG. 6B. This can, if desired, then be further reduced to specific lookup tables for each operation (e.g. set, reset).

FIG. 12B examines the group by programming parameter step of FIG. 12A more closely. It has the table of recorded data 1205b, which contains an initial state 1206b, a programming parameter 1207b applied to that initial state, and a subsequent state 1208b. FIG. 12B also contains the sets of programming parameters 1210b. These contain a name 1211b for each programming parameter, a voltage height 1212b, and a pulse width 1213b. Only voltage height and pulse width are depicted here for illustrative purposes, although other programming parameters are possible.

In FIG. 12B the algorithm goes through the table of recorded data, grouping the data by programming parameter 1207b. This results in new tables, one for each programming parameter. Here, using the exemplary three programming parameters A, B, and C, three tables result. The first table for programming parameter A 1220b contains the initial state 1221b and the subsequent state 1222b only for operations that involved programming parameter A being applied to the initial state. The second table for programming parameter B 1225b contains the initial state 1226b and the subsequent state 1227b only for operations that involved programming parameter B being applied to the initial state. The third table for programming parameter C 1230b contains the initial state 1231b and the subsequent state 1232b only for operations that involved programming parameter C being applied to the initial state. In this manner the algorithm depicted in FIG. 12B groups the recorded data by programming parameter.

FIG. 12C examines the group by source state step of the algorithm depicted in FIG. 12A. FIG. 12C constrains itself to examining the process for the data from one programming parameter only, here programming parameter B. An analogous process occurs for each programming parameter, only one is considered here for purposes of illustration.

FIG. 12C shows a table of recorded data 1225c that involved programming parameter B, as generated by the algorithm depicted in FIG. 12B. This data contains an initial state 1226c and a subsequent state 1227c. The algorithm depicted in FIG. 12C next groups the data by source state, using the state table 1215a from FIG. 12A. For example, all the entries that have an initial state falling within the region for state 1 (the span marked by 1234c) are placed together in the frequency graph for region 1 1235c. This frequency graph depicts the distribution of the subsequent resistance for all initial resistances within the source state 1. This frequency graph is analyzed to provide an average value 1236c, here a subsequent resistance of 507 K. A similar process groups all the entries that have an initial state falling within the region for state 2 (the span marked by 1239c) into the frequency graph for region 2 1240c. This frequency graph depicts the distribution of the subsequent resistance for all initial resistances within the source state 2. This frequency graph is analyzed to provide an average value 1241c: a subsequent resistance of 250K. Similarly, all the entries that have an initial state falling within the region for state 3 (the span marked by 1244c) are grouped into the frequency graph for region 3 1245c. This frequency graph depicts the distribution of the subsequent resistance for all initial resistances within the source state 3. This frequency graph is analyzed to provide an average value 1246c: a subsequent resistance of 105K.

FIG. 12D examines the construction of a state-to-state transition chart 1270a as explained in FIG. 12A. FIG. 12D has several components. Foremost, it has the state-to-state transition chart 1270d. The x-axis of this chart demarcates various states, here source states 1 (1280d), 2 (1281d), and 3 (1282d). The y-axis of this chart demarcates these same states, destination states 1 (1285d), 2 (1286d), and 3 (1287d). The y-axis represents the subsequent resistance. FIG. 12D also has, as input, data about each state after the application of a programming parameter, provided either in frequency graphs (e.g. 1235d, 1240d, and 1245) or in tables (e.g. 1250a, 1255a, and 1260a of FIG. 12A)

For example, FIG. 12D has state 1 after the application of programming parameter set B, depicted in frequency graph 1235d, with an average subsequent resistance value 1236d of 507K. This value is then plotted on the state-to-state transition chart 1270d, resulting in the point 1273d, which is placed on the y-axis at 507K resistance (which falls within destination state 2) and is placed on the x-axis within source state 1.

Similarly, frequency graph 1240d depicts state 2 after the application of programming parameter set B, with an average subsequent resistance value 1241d of 250K. This value is then plotted on the state-to-state transition chart 1270d, resulting in the point 1276d, which is placed on the y-axis at 250K resistance (which falls within destination state 1) and is placed on the x-axis within source state 2.

Similarly, frequency graph 1245d depicts state 3 after the application of programming parameter set B, with an average subsequent resistance value 1246d of 105K. This value is then plotted on the state-to-state transition chart 1270d, resulting in the point 1279d, which is placed on the y-axis at 105K resistance (which falls within destination state 1) and is placed on the x-axis within source state 3.

An analogous process occurs for programming parameters A and C for each region, resulting in the points 1271d (state 1 after programming parameter C), 1272d (state 1 after programming parameter A), 1274d (state 2 after programming parameter C), 1275d (state 2 after programming parameter A), 1277d (state 3 after programming parameter C), and 1278d (state 3 after programming parameter A).

After the process of FIG. 12D, the final steps of FIG. 12A assemble the information into a lookup table, as described in the detailed description for FIG. 12A above.

It should be noted that though the analysis depicted in FIGS. 12A-12D and described in detail above describes a specific method to illustrate a lookup table analysis operation, the methods of the present disclosure should not be limited to this specific example. Indeed, it will be clear to those skilled in the art that the lookup table analysis operation detailed in FIGS. 12A-12D could be adjusted in a plurality of ways to optimize it for a specific application.

It is preferred, then, that the preceding description of a lookup table analysis operation process be representative and inclusive of these variations and not otherwise limited to the specific illustrative parameters detailed.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of adjusting the resistance of a non-volatile resistive change element from a first state to a desired second state, comprising:
    inspecting a resistive change element to determine a first state;
    determining if said first state is distinct from a desired second state;
    selecting a set of stimulus parameters from a pre-generated list of stimulus parameter sets, wherein said selected set of stimulus parameters are selected in response to said determined first state and said desired second state and correspond to a transition from said determined first state to said desired second state, when said determined first state is distinct from said desired second state; and
    applying said selected set of stimulus parameters to said resistive change element, when said determined first state is distinct from said desired second state.

2. The method of claim 1 wherein said step of inspecting comprises applying a test voltage to said resistive change element and measuring a resulting current through said resistive change element.

3. The method of claim 2 wherein said resulting current is measured using an ammeter in series with said resistive change element.

4. The method of claim 2 wherein said test voltage is provided by a voltage source.

5. The method of claim 4 wherein said resulting current is measured by monitoring the current supplied by said voltage source.

6. The method of claim 4 wherein said voltage source is a programmable power supply.

7. The method of claim 4 wherein said voltage source is a sense amplifier.

8. The method of claim 1 wherein said step of inspecting comprises supplying a test current to said resistive change element and measuring a resulting voltage across said resistive change element.

9. The method of claim 8 wherein said resulting voltage is measured using a voltmeter across said resistive change element.

10. The method of claim 8 wherein said test current is supplied by a current source.

11. The method of claim 10 wherein said resulting voltage is measured by monitoring the voltage supplied by said current source.

12. The method of claim 10 wherein said current source is a programmable power supply.

13. The method of claim 10 wherein said current source is a sense amplifier.

14. The method of claim 1 wherein said pre-generated list of stimulus parameter sets includes a plurality of resistance value ranges.

15. The method of claim 1 wherein said pre-generated list of stimulus parameter sets includes a plurality of voltage value ranges.

16. The method of claim 1 wherein said pre-generated list of stimulus parameter sets includes a plurality of current value ranges.

17. The method of claim 1 wherein said selected set of stimulus parameters includes at least one of voltage level, pulse width, rise time, fall time, series resistance, and supply current.

18. The method of claim 1 wherein external environmental conditions are used to select said set of stimulus parameters from said pre-generated list of stimulus parameter sets.

19. The method of claim 18 wherein said external environmental conditions include at least one of temperature, humidity, air pressure, air quality, radiation levels, and stress.

20. The method of claim 1 wherein at least one of said steps of inspecting, determining, selecting, and applying is performed via a software program.

21. The method of claim 20 wherein said software program is executed on a personal computer.

22. The method of claim 20 wherein said software program is executed on a processing element in electrical communication with said resistive change element.

23. The method of claim 1 wherein at least one of said steps of inspecting, determining, selecting, and applying is performed via an electrical circuit.

24. The method of claim 23 where said electrical circuit includes at least one of a microprocessor, an FPGA, a CPLD, or a microcontroller.

25. The method of claim 23 wherein said electrical circuit includes analog power supply.

26. The method of claim 1 wherein said step of applying said selected set of stimulus parameters to said resistive change element adjusts the state of said resistive change element from a high resistive state to a low resistive state.

27. The method of claim 1 wherein said step of applying said selected set of stimulus parameters to said resistive change element adjusts the state of said resistive change element from a low resistive state to a high resistive state.

28. The method of claim 1 wherein said step of applying said selected set of stimulus parameters to said resistive change element adjusts the state of said resistive change element from one predefined resistive range to one of at least two other predefined resistance ranges.

29. The method of claim 1 wherein said selected set of stimulus parameters are applied to said resistive change element once.

30. The method of claim 1 wherein at least one of said steps of inspecting, determining, selecting, and applying is repeated at least once.

31. The method of claim 1 wherein said resistive change element is a two terminal nanotube switching element.

32. The method of claim 1 wherein said resistive change element is a metal oxide memory cell.

33. The method of claim 1 wherein said resistive change element is a phase change memory cell.

34. The method of claim 1 wherein said pre-generated list of stimulus parameter sets is a look up table.

35. The method of claim 1 wherein said pre-generated list of stimulus parameter sets is generated through a characterizing process performed on an array of resistive change memory elements.

* * * * *